(12) United States Patent
Mori et al.

(10) Patent No.: US 12,101,991 B2
(45) Date of Patent: Sep. 24, 2024

(54) COMPOSITION CONTAINING ORGANIC SEMICONDUCTOR, SOLUTION FOR FORMING ORGANIC SEMICONDUCTOR LAYER, ORGANIC SEMICONDUCTOR LAYER, AND ORGANIC THIN FILM TRANSISTOR

(71) Applicant: TOSOH CORPORATION, Shunan (JP)

(72) Inventors: Takahiro Mori, Yokkaichi (JP); Takashi Fukuda, Yokkaichi (JP)

(73) Assignee: TOSOH CORPORATION, Shunan (JP)

( * ) Notice: Subject to any disclaimer, the term of this patent is extended or adjusted under 35 U.S.C. 154(b) by 660 days.

(21) Appl. No.: 17/415,438

(22) PCT Filed: Dec. 19, 2019

(86) PCT No.: PCT/JP2019/049943
§ 371 (c)(1),
(2) Date: Jun. 17, 2021

(87) PCT Pub. No.: WO2020/130104
PCT Pub. Date: Jun. 25, 2020

(65) Prior Publication Data
US 2022/0059768 A1 Feb. 24, 2022

(30) Foreign Application Priority Data
Dec. 20, 2018 (JP) .................... 2018-238175

(51) Int. Cl.
*H10K 85/10* (2023.01)
*C08F 22/40* (2006.01)
*C08K 5/45* (2006.01)
*H10K 10/46* (2023.01)
*H10K 85/60* (2023.01)

(52) U.S. Cl.
CPC ............ *H10K 85/111* (2023.02); *C08F 22/40* (2013.01); *C08K 5/45* (2013.01); *H10K 85/141* (2023.02); *H10K 85/6576* (2023.02); *C08K 2201/001* (2013.01); *H10K 10/464* (2023.02); *H10K 10/466* (2023.02); *H10K 10/488* (2023.02)

(58) Field of Classification Search
CPC ............ H10K 85/111; H10K 85/6576; H10K 85/141; H10K 85/466; H10K 85/464; H10K 85/488; C08F 22/40
See application file for complete search history.

(56) References Cited

U.S. PATENT DOCUMENTS

| 2003/0067005 A1* | 4/2003 | De Leeuw ........... H10K 10/468 257/72 |
| --- | --- | --- |
| 2004/0038459 A1 | 2/2004 | Brown et al. |
| 2010/0001264 A1 | 1/2010 | Aramaki et al. |
| 2015/0250078 A1 | 9/2015 | Matsuda et al. |

FOREIGN PATENT DOCUMENTS

| CN | 108774311 A | | 11/2018 |
| --- | --- | --- | --- |
| JP | 2004-525501 A | | 8/2004 |
| JP | 2008-60558 A | | 3/2008 |
| JP | 2012-209329 | * | 10/2012 |
| JP | 2012-209329 A | | 10/2012 |
| JP | 2013-14750 A | | 1/2013 |
| JP | 2014-112510 A | | 6/2014 |
| JP | 2018-137442 A | | 8/2018 |
| JP | 2018-174322 A | | 11/2018 |
| WO | WO 2018/181462 | * | 10/2018 |

OTHER PUBLICATIONS

Translation for JP 2012-209329, Oct. 25, 2012.*
International Search Report issued Mar. 10, 2020 in PCT/JP2019/049943, 2 pages.
International Preliminary Report on Patentability and Written Opinion issued Jun. 16, 2021 in PCT/JP2019/049943, 6 pages.
Extended European Search Report issued Sep. 12, 2022 in European Patent Application No. 19900118.1, 6 pages.

* cited by examiner

*Primary Examiner* — C Melissa Koslow
(74) *Attorney, Agent, or Firm* — Oblon, McClelland, Maier & Neustadt, L.L.P.

(57) ABSTRACT

Provided are (i) a solution for forming an organic semiconductor layer which solution has excellent coating property, (ii) an organic semiconductor which is produced with use of the solution and which has high heat resistance, (iii) a layer which contains the organic semiconductor, and (iv) an organic thin film transistor which exhibits high electrical properties. A composition containing: an organic semiconductor; and a polymer (1) having at least one unit selected from the group consisting of units represented by formulae (1-a), (1-b) and (1-c) given below. A composition containing the organic semiconductor, the polymer (1) and an organic solvent can be suitably used as a solution for forming an organic semiconductor layer.

6 Claims, 1 Drawing Sheet

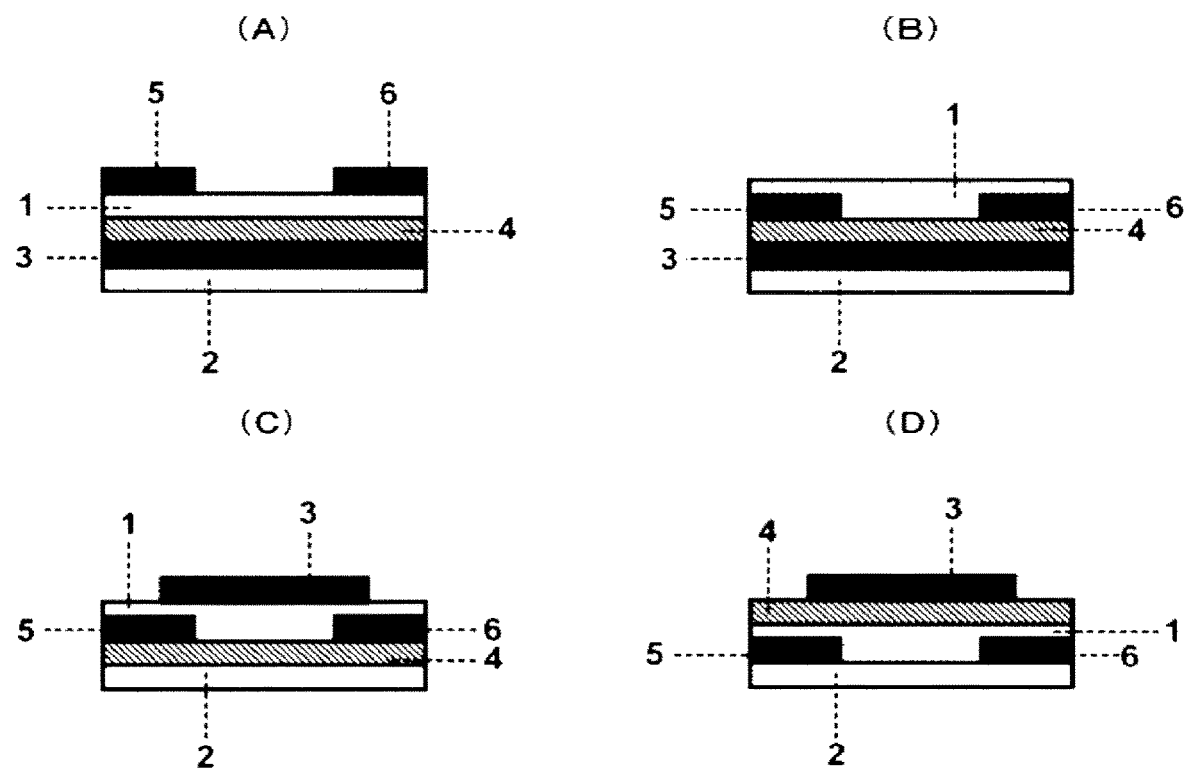

COMPOSITION CONTAINING ORGANIC SEMICONDUCTOR, SOLUTION FOR FORMING ORGANIC SEMICONDUCTOR LAYER, ORGANIC SEMICONDUCTOR LAYER, AND ORGANIC THIN FILM TRANSISTOR

This application is a National Stage (371) of PCT/JP2019/049943, filed on Dec. 19, 2019, which claims priority to JP 2018-238175, filed on Dec. 20, 2018.

TECHNICAL FIELD

The present invention relates to a composition containing an organic semiconductor, a solution for forming an organic semiconductor, an organic semiconductor layer, and an organic thin film transistor. In particular, the present invention relates to (i) a solution for forming an organic semiconductor layer which solution contains a low-molecular organic semiconductor and which solution has such an excellent coating property as to be applicable to a printing method, (ii) an organic semiconductor layer which is formed with use of the solution, and (iii) an organic thin film transistor.

BACKGROUND ART

Organic semiconductor devices, typified by organic thin film transistors, have been attracting attention in recent years, because they have characteristics that are not found in inorganic semiconductor devices, such as characteristics of being energy-saving, low-cost, and flexible. The organic semiconductor devices are constituted by several kinds of material, such as organic semiconductor layers, substrates, insulating layers, and electrodes. Among them, the organic semiconductor layers, which are responsible for carrier transfer of electric charges, play central roles in the devices. The performance of the organic semiconductor devices depends on the carrier mobility of organic materials of which the organic semiconductor layers are made. Therefore, appearance of organic materials that impart high carrier mobility has been desired.

As an organic material, an organic semiconductor having a dithienobenzodithiophene backbone is disclosed (Patent Document 1)

Further, an organic material made of a combination of such an organic semiconductor and a polymer other than the organic semiconductor is also reported (Patent Document 2).

An organic semiconductor layer disclosed in Patent Literature 1 has high mobility. However, a higher coating property has been demanded. Further, even though an organic semiconductor and a polymer are simply combined as in Patent Document 2, the properties of an organic thin film transistor are not yet sufficient. There is also a problem with the heat resistance of the polymer. Thus, there is room for improvements in coating property, heat resistance, and carrier mobility.

CITATION LIST

Patent Literature

Patent Literature 1: Japanese Patent Application Publication Tokukai No. 2012-209329
Patent Literature 2: Published Japanese Translation of PCT International Application Tokuhyo No. 2004-525501

SUMMARY OF INVENTION

Technical Problem

The present invention has been made in view of the above demand and problems, and the object of the present invention is to provide (i) a composition which contains an organic semiconductor having an excellent coating property and excellent heat resistance, (ii) a solution for forming an organic semiconductor layer, (iii) an organic semiconductor layer which is obtained with use of the solution and which has excellent heat resistance, and (iv) an organic thin film transistor which has high heat resistance and high mobility.

Solution to Problem

As a result of conducting diligent studies in order to attain the above object, the inventors of the present invention found that by forming an organic semiconductor layer with use of a solution containing a composition which contains an organic semiconductor and a polymer that has a particular structure, the resultant organic thin film transistor has both excellent electrical characteristics and high heat resistance. Consequently, the inventors of the present invention completed the present invention.

Specifically, the present invention includes the following aspects [1] through [6].

[1] A composition containing: an organic semiconductor; and a polymer (1) having at least one unit selected from the group consisting of units represented by the following formulae (1-a), (1-b), and (1-c):

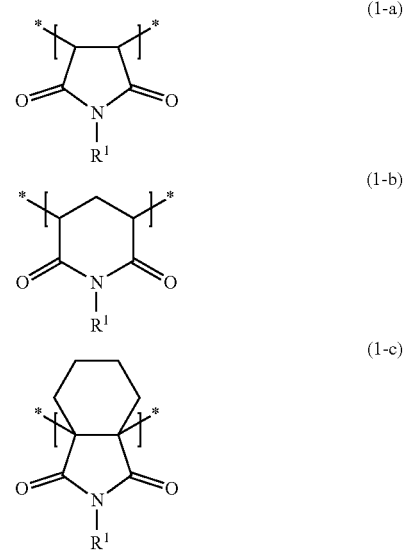

where $R^1$ represents an organic group selected from the group consisting of a hydrogen atom, halogen atoms, alkyl groups having 1 to 20 carbon atoms, alkoxy groups having 1 to 20 carbon atoms, aryl groups having 4 to 20 carbon atoms, alkenyl groups having 2 to 20 carbon atoms, alkynyl groups having 2 to 20 carbon atoms, and cycloalkyl groups having 3 to 20 carbon atoms.

[2] The composition as described in [1], wherein the organic semiconductor is a compound represented by the following formula (2):

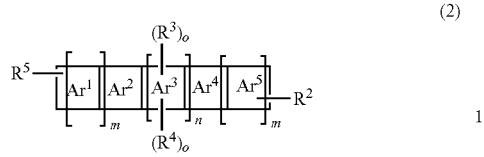

where: ring systems $Ar^1$ and $Ar^5$ each independently represent a ring selected from the group consisting of a thiophene ring, a thiazole ring, and a benzene ring; ring systems $Ar^2$ and $Ar^4$ each independently represent a ring selected from the group consisting of a thiophene ring, a benzene ring, and a cyclobutene ring; a ring system $Ar^3$ represents a ring selected from the group consisting of a benzene ring, a thiophene ring, and a cyclobutene ring; $R^2$ and $R^5$ each independently represent a group selected from the group consisting of a hydrogen atom, halogen atoms, alkyl groups having 1 to 20 carbon atoms, aryl groups having 4 to 20 carbon atoms, alkenyl groups having 2 to 20 carbon atoms, and alkynyl groups having 2 to 20 carbon atoms; $R^3$ and $R^4$ each independently represent a group selected from the group consisting of a hydrogen atom, alkyl groups having 1 to 20 carbon atoms, alkoxy groups having 1 to 20 carbon atoms, and trialkylsilylethynyl groups; m represents an integer of 1 or 2; n represents an integer of 0 to 2; o represents an integer of 0 or 1; and in a case where the ring system $Ar^3$ is a thiophene ring or a cyclobutene ring, o is an integer of 0.

[3] The composition as described in [1] or [2], wherein the organic semiconductor is a compound represented by at least any one of the following formulae (3) and (4):

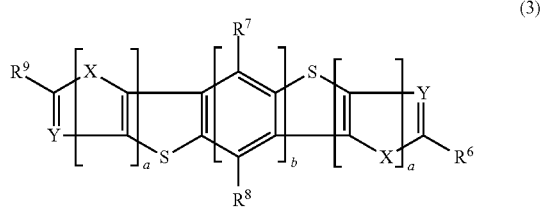

where: X represents any one of a sulfur atom and —CH=CH—; Y represents any one of =CH— and a nitrogen atom; $R^6$ and $R^9$ each independently represent a group selected from the group consisting of a hydrogen atom, halogen atoms, alkyl groups having 1 to 20 carbon atoms, alkoxy groups having 1 to 20 carbon atoms, aryl groups having 4 to 20 carbon atoms, alkenyl groups having 2 to 20 carbon atoms, and alkynyl groups having 2 to 20 carbon atoms and may be identical to or different from each other; $R^7$ and $R^8$ each independently represents a group selected from the group consisting of a hydrogen atom, alkyl groups having 1 to 20 carbon atoms, alkoxy groups having 1 to 20 carbon atoms, and trialkylsilylethynyl groups; a represents an integer of 1 or 2; b represents an integer of 0 to 2; and in a case where X is —CH=CH—, Y represents =CH—; and

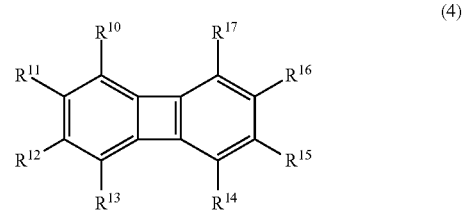

where: one to three of combinations of adjacent two of $R^{10}$ to $R^{17}$ constitute a unit represented by the following formula (5) and form a five-membered or six-membered ring; and the other of $R^{10}$ to $R^{17}$, which do not constitute the unit represented by the following formula (5), each independently represents a group selected from the group consisting of a hydrogen atom, halogen atoms, alkyl groups having 1 to 20 carbon atoms, alkenyl groups having 2 to 20 carbon atoms, alkynyl groups having 2 to 20 carbon atoms, and aryl groups having 4 to 26 carbon atoms:

where: X represents one selected from the group consisting of an oxygen atom, a sulfur atom, a selenium atom, $CR^{19}=CR^{20}$, and $NR^{21}$; Y represents any one of $CR^{22}$ and a nitrogen atom; and $R^{18}$ to $R^{22}$ each independently represents a group selected from the group consisting of a hydrogen atom, halogen atoms, alkyl groups having 1 to 20 carbon atoms, alkenyl groups having 2 to 20 carbon atoms, alkynyl groups having 2 to 20 carbon atoms, and aryl groups having 4 to 26 carbon atoms.

[4] A solution for forming an organic semiconductor layer, containing: a composition as described in any one of [1] through [3]; and an organic solvent.

[5] An organic semiconductor layer containing a composition as described in any one of [1] through [3].

[6] An organic thin film transistor including an organic semiconductor layer as described in [5].

The present invention relates to (i) a composition which contains an organic semiconductor and a polymer that has at least one unit selected from the group consisting of units represented by formulae (1-a), (1-b), and (1-c), (ii) a solution for forming an organic semiconductor layer which solution contains the composition, (iii) an organic semiconductor layer which is formed with use of the solution, and (iv) an organic thin film transistor:

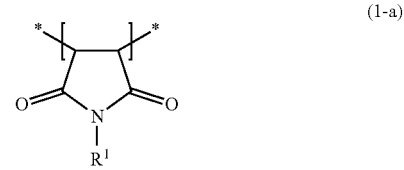

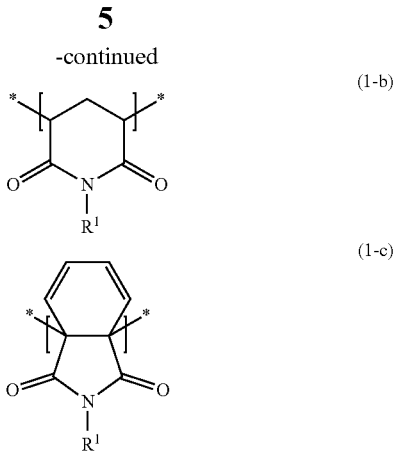

where R¹ represents an organic group selected from the group consisting of a hydrogen atom, halogen atoms, alkyl groups having 1 to 20 carbon atoms, alkoxy groups having 1 to 20 carbon atoms, aryl groups having 4 to 20 carbon atoms, alkenyl groups having 2 to 20 carbon atoms, alkynyl groups having 2 to 20 carbon atoms, and cycloalkyl groups having 3 to 20 carbon atoms.

The present invention is described below in more detail.

A composition in accordance with an embodiment of the present invention is characterized by containing an organic semiconductor and a polymer (1).

The polymer (1), which is a constituent of the composition in accordance with an embodiment of the present invention, is characterized by having a unit selected from the group consisting of formulae (1-a), (1-b), and (1-c).

In formulae (1-a), (1-b), and (1-c), R¹ represents a group selected from the group consisting of a hydrogen atom, halogen atoms, alkyl groups having 1 to 20 carbon atoms, alkoxy groups having 1 to 20 carbon atoms, aryl groups having 4 to 20 carbon atoms, alkenyl groups having 2 to 20 carbon atoms, alkynyl groups having 2 to 20 carbon atoms, and cycloalkyl groups having 3 to 20 carbon atoms.

The halogen atoms in R¹ include a fluorine atom, a chlorine atom, a bromine atom, and an iodine atom.

Examples of the alkyl groups having 1 to 20 carbon atoms in R¹ include groups selected from the group consisting of linear or branched alkyl groups such as a methyl group, an ethyl group, an n-propyl group, an n-butyl group, an isobutyl group, an n-pentyl group, an n-hexyl group, an isohexyl group, an n-heptyl group, an n-octyl group, an n-nonyl group, an n-decyl group, an n-dodecyl group, an n-tetradecyl group, an n-octadecyl group, a 2-ethylhexyl group, a 3-ethylheptyl group, 3-ethyldecyl, and a 2-hexyldecyl group.

Examples of the alkoxy groups having 1 to 20 carbon atoms in R¹ include groups selected from the group consisting of linear or branched alkyl groups such as a methoxy group, an ethoxy group, an n-propoxy group, an n-butoxy group, an isobutoxy group, an n-pentyloxy group, an n-hexyloxy group, an isohexyloxy group, an n-heptyloxy group, an n-octyloxy group, an n-nonyloxy group, an n-decyloxy group, an n-dodecyloxy group, an n-tetradecyloxy group, a 2-ethylhexyloxy group, a 3-ethylheptyloxy group, and a 2-hexyldecyloxy group.

Examples of the aryl groups having 4 to 20 carbon atoms in R¹ include groups selected from the group consisting of: alkyl-substituted phenyl groups such as a phenyl group, a p-tolyl group, a p-(n-hexyl)phenyl group, a p-(n-octyl)phenyl group, and a p-(2-ethylhexyl)phenyl group; a 2-furyl group; a 2-thienyl group; and alkyl-substituted chalcogenophene groups such as a 5-fluoro-2-furyl group, a 5-methyl-2-furyl group, a 5-ethyl-2-furyl group, a 5-(n-propyl)-2-furyl group, a 5-(n-butyl)-2-furyl group, a 5-(n-pentyl)-2-furyl group, a 5-(n-hexyl)-2-furyl group, a 5-(n-octyl)-2-furyl group, a 5-(2-ethylhexyl)-2-furyl group, a 5-fluoro-2-thienyl group, a 5-methyl-2-thienyl group, a 5-ethyl-2-thienyl group, a 5-(n-propyl)-2-thienyl group, a 5-(n-butyl)-2-thienyl group, a 5-(n-pentyl)-2-thienyl group, a 5-(n-hexyl)-2-thienyl group, a 5-(n-octyl)-2-thienyl group, and a 5-(2-ethylhexyl)-2-thienyl group.

Examples of the alkenyl groups having 2 to 20 carbon atoms in R¹ include groups selected from the group consisting of an ethenyl group, an n-propenyl group, an n-butenyl group, an n-pentenyl group, an n-hexenyl group, an n-heptenyl group, an n-octenyl group, an n-nonenyl group, an n-decenyl group, an n-dodecenyl group, and the like.

Examples of the alkynyl groups having 2 to 20 carbon atoms in R¹ include groups selected from the group consisting of an ethynyl group, an n-propynyl group, an n-butynyl group, an n-pentynyl group, an n-hexynyl group, an n-heptynyl group, an n-octynyl group, an n-nonynyl group, an n-decynyl group, an n-dodecynyl group, and the like.

Examples of the cycloalkyl groups having 3 to 20 carbon atoms in R¹ include groups selected from the group consisting of a cyclopropyl group, a cyclobutyl group, a cyclopentyl group, a cyclohexyl group, a cyclononyl group, a cyclodecyl group, a cyclododecyl group, and the like.

The polymer (1) in an embodiment of the present invention has at least one unit selected from the group consisting of units represented by formulae (1-a), (1-b), and (1-c).

As the polymer (1) used in an embodiment of the present invention, one kind of polymer can be used alone or two or more kinds of polymer can be alternatively used as a mixture. Alternatively, one kind or two or more kinds of polymer different in molecular weight can be used in admixture. Alternatively, a copolymer of two or more kinds of polymer may be used.

In the step of manufacturing a flexible electronic device in which an organic semiconductor is employed, there is the step of heating an organic semiconductor layer at a temperature of not lower than 90° C. after forming the organic semiconductor layer. In this step, it is necessary to prevent a deterioration in performance of the organic semiconductor layer. For this reason, the glass transition point (Tg) of the polymer (1) contained in the composition in accordance with an embodiment of the present invention falls within the range of preferably not lower than 95° C. but not higher than 300° C., more preferably not lower than 110° C. but not higher than 300° C., and particularly preferably not lower than 120° C. but not higher than 300° C.

The weight-average molecular weight (Mw) of the polymer (1) contained in the composition in accordance with an embodiment of the present invention is preferably 10,000 to 1,000,000. The molecular weight can be measured by gel permeation chromatography at 40° C.

Specific examples of the constitutional unit which the polymer (1) has include the following compounds:

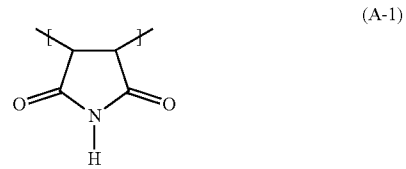

(A-2) 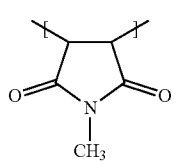

(A-3) 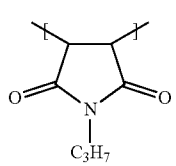

(A-4) 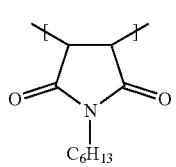

(A-5) 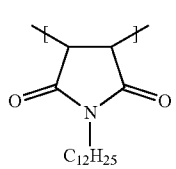

(A-6) 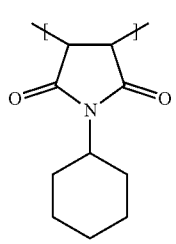

(A-7) 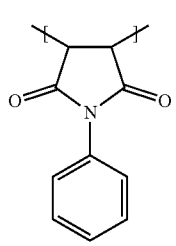

(A-8) 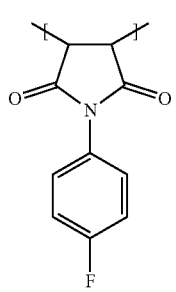

(A-9) 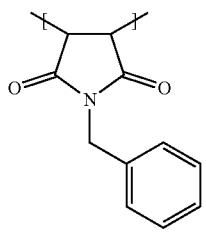

(A-10) 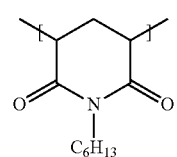

(A-11) 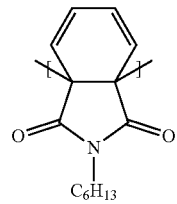

(A-12) 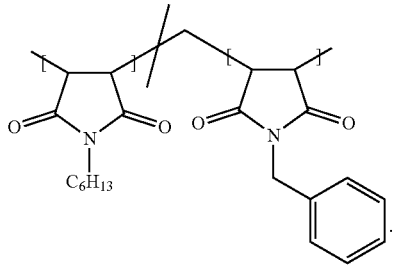

The polymer (1) is preferably at least one of the group consisting of (A-2), (A-3), (A-4), (A-5), (A-6), (A-9), and (A-12), and more preferably at least one of the group consisting of (A-4), (A-6), and (A-12). This advantageously imparts high mobility and high heat resistance to an organic semiconductor layer.

The organic semiconductor contained in the composition in accordance with an embodiment of the present invention is not limited to any particular one, provided that the organic semiconductor has semiconducting properties. As the organic semiconductor, either a low-molecular semiconductor or a high-molecular semiconductor can be used.

In a case where the organic semiconductor used in an embodiment of the present invention is a low-molecular semiconductor, the organic semiconductor can be, for example, a compound represented by the following formula (2):

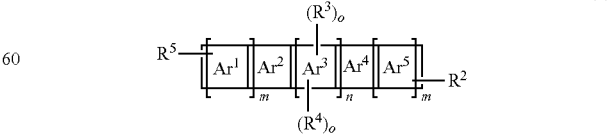

(2)

where: ring systems $Ar^1$ and $Ar^5$ each independently represent a ring selected from the group consisting of a thiophene ring, a thiazole ring, and a benzene ring; ring systems $Ar^2$ and $Ar^4$ each independently represent a ring selected from the group consisting of a thiophene ring, a benzene ring, and a cyclobutene ring; a ring system $Ar^3$ represents a ring selected from the group consisting of a benzene ring, a thiophene ring, and a cyclobutene ring; $R^2$ and $R^3$ each independently represent a group selected from the group consisting of a hydrogen atom, halogen atoms, alkyl groups having 1 to 20 carbon atoms, aryl groups having 4 to 20 carbon atoms, alkenyl groups having 2 to 20 carbon atoms, and alkynyl groups having 2 to 20 carbon atoms; $R^3$ and $R^4$ each independently represent a group selected from the group consisting of a hydrogen atom, alkyl groups having 1 to 20 carbon atoms, alkoxy groups having 1 to 20 carbon atoms, and trialkylsilylethynyl groups; m represents an integer of 1 or 2; n represents an integer of 0 to 2; o represents an integer of 0 or 1; and in a case where the ring system $Ar^3$ is a thiophene ring or a cyclobutene ring, o is an integer of 0.

The ring systems $Ar^1$ and $Ar^5$ in the organic semiconductor each independently represent a ring selected from the group consisting of a thiophene ring, a thiazole ring, and a benzene ring. Since each of the thiophene ring and the thiazole ring allows the organic semiconductor to exhibit higher mobility, any of the thiophene ring and the thiazole ring is preferable.

The ring systems $Ar^2$ and $Ar^4$ each independently represent a ring selected from the group consisting of a thiophene ring, a benzene ring, and a cyclobutene ring. Since the thiophene ring allows the organic semiconductor to exhibit higher oxidation resistance, the thiophene ring is preferable.

The ring system $Ar^3$ represents a ring selected from the group consisting of a benzene ring, a thiophene ring, and a cyclobutene ring. Since the benzene ring allows the organic semiconductor to exhibit higher heat resistance, the benzene ring is preferable.

$R^2$ and $R^5$ each independently represent a group selected from the group consisting of a hydrogen atom, halogen atoms, alkyl groups having 1 to 20 carbon atoms, aryl groups having 4 to 20 carbon atoms, alkenyl groups having 2 to 20 carbon atoms, and alkynyl groups having 2 to 20 carbon atoms. From the viewpoint of the solubility of the organic semiconductor in an organic solvent, $R^2$ and $R^5$ are each preferably an alkyl group having 1 to 20 carbon atoms.

Examples of the halogen atoms in each of $R^2$ and $R^5$ include a fluorine atom, a chlorine atom, a bromine atom, and an iodine atom.

Examples of the alkyl groups having 1 to 20 carbon atoms in each of $R^2$ and $R^5$ include groups selected from the group consisting of linear or branched alkyl groups such as a methyl group, an ethyl group, an n-propyl group, an n-butyl group, an isobutyl group, an n-pentyl group, an n-hexyl group, an isohexyl group, an n-heptyl group, an n-octyl group, an n-nonyl group, an n-decyl group, an n-dodecyl group, an n-tetradecyl group, an n-octadecyl group, a 2-ethylhexyl group, a 3-ethylheptyl group, 3-ethyldecyl, and a 2-hexyldecyl group. Among the above groups, alkyl groups having 3 to 12 carbon atoms are preferable, and a group selected from the group consisting of n-propyl, an n-butyl group, an n-pentyl group, an n-hexyl group, an n-heptyl group, an n-octyl group, an n-nonyl group, and an n-decyl group is more preferable, because these groups particularly allow the organic semiconductor to exhibit high mobility and high solubility with respect to an organic solvent.

Examples of the aryl groups having 4 to 20 carbon atoms in each of $R^2$ and $R^5$ include groups selected from the group consisting of: alkyl-substituted phenyl groups such as a phenyl group, a p-tolyl group, a p-(n-hexyl)phenyl group, a p-(n-octyl)phenyl group, and a p-(2-ethylhexyl)phenyl group; a 2-furyl group; a 2-thienyl group; and alkyl-substituted chalcogenophene groups such as a 5-fluoro-2-furyl group, a 5-methyl-2-furyl group, a 5-ethyl-2-furyl group, a 5-(n-propyl)-2-furyl group, a 5-(n-butyl)-2-furyl group, a 5-(n-pentyl)-2-furyl group, a 5-(n-hexyl)-2-furyl group, a 5-(n-octyl)-2-furyl group, a 5-(2-ethylhexyl)-2-furyl group, a 5-fluoro-2-thienyl group, a 5-methyl-2-thienyl group, a 5-ethyl-2-thienyl group, a 5-(n-propyl)-2-thienyl group, a 5-(n-butyl)-2-thienyl group, a 5-(n-pentyl)-2-thienyl group, a 5-(n-hexyl)-2-thienyl group, a 5-(n-octyl)-2-thienyl group, and a 5-(2-ethylhexyl)-2-thienyl group.

Examples of the alkenyl groups having 2 to 20 carbon atoms in each of $R^2$ and $R^5$ include groups selected from the group consisting of an ethenyl group, an n-propenyl group, an n-butenyl group, an n-pentenyl group, an n-hexenyl group, an n-heptenyl group, an n-octenyl group, an n-nonenyl group, an n-decenyl group, an n-dodecenyl group, and the like.

Examples of the alkynyl groups having 2 to 20 carbon atoms in each of $R^2$ and $R^5$ include groups selected from the group consisting of an ethynyl group, an n-propynyl group, an n-butynyl group, an n-pentynyl group, an n-hexynyl group, an n-heptynyl group, an n-octynyl group, an n-nonynyl group, an n-decynyl group, an n-dodecynyl group, and the like.

$R^3$ and $R^4$ each independently represent a group selected from the group consisting of a hydrogen atom, trialkylsilylethynyl groups, alkyl groups having 1 to 20 carbon atoms, and alkoxy groups having 1 to 20 carbon atoms. Since the hydrogen atom allows the organic semiconductor to exhibit higher mobility, the hydrogen atom is preferable.

Examples of the trialkylsilylethynyl groups in each of $R^3$ and $R^4$ include groups selected from the group consisting of a trimethylsilylethynyl group, a triethylsilylethynyl group, a triisopropylsilylethynyl group, and the like.

Examples of the alkyl groups having 1 to 20 carbon atoms in each of $R^3$ and $R^4$ include groups selected from the group consisting of linear or branched alkyl groups such as a methyl group, an ethyl group, an n-propyl group, an n-butyl group, an isobutyl group, an n-pentyl group, an n-hexyl group, an isohexyl group, an n-heptyl group, an n-octyl group, an n-nonyl group, an n-decyl group, an n-dodecyl group, an n-tetradecyl group, an n-octadecyl group, a 2-ethylhexyl group, a 3-ethylheptyl group, 3-ethyldecyl, and a 2-hexyldecyl group. Among the above groups, alkyl groups having 1 to 8 carbon atoms are preferable, and a group selected from the group consisting of a methyl group, an ethyl group, an n-propyl group, an n-butyl group, an n-pentyl group, an n-hexyl group, an n-heptyl group, and an n-octyl group is more preferable, because these groups particularly allow the organic semiconductor to exhibit high mobility and high solubility with respect to an organic solvent.

Examples of the alkoxy groups having 1 to 20 carbon atoms in each of $R^3$ and $R^4$ include groups selected from the group consisting of linear or branched alkyl groups such as a methoxy group, an ethoxy group, an n-propoxy group, an n-butoxy group, an isobutoxy group, an n-pentyloxy group, an n-hexyloxy group, an isohexyloxy group, an n-heptyloxy group, an n-octyloxy group, an n-nonyloxy group, an n-decyloxy group, an n-dodecyloxy group, an n-tetradecyloxy group, a 2-ethylhexyloxy group, a 3-ethylheptyloxy group, and a 2-hexyldecyloxy group. Among the above groups, alkoxy groups having 1 to 8 carbon atoms are preferable, and a group selected from the group consisting of a methoxy group, an ethoxy group, an n-propoxy group, an n-butoxy group, an isobutoxy group, an n-pentyloxy group, an n-hexyloxy group, an isohexyloxy group, an n-heptyloxy group, and an n-octyloxy group is more preferable, because these groups particularly allow the organic semiconductor to exhibit high mobility and high solubility with respect to an organic solvent.

m is an integer of 1 or 2. m is preferably an integer of 1, because this allows the organic semiconductor to exhibit high solubility with respect to an organic solvent.

n represents an integer of 0 to 2. n is preferably an integer of 1, because this allows the π stacking of the organic semiconductor to be strong.

o represents an integer of 0 or 1. o is preferably an integer of 0, because this allows the organic semiconductor to exhibit high heat resistance. Note that in a case where the ring system $Ar^3$ is the thiophene ring or the cyclobutene ring, o is an integer of 0.

The organic semiconductor used in an embodiment of the present invention preferably has five or more condensed rings, because this allows the organic semiconductor to have a high melting point.

The organic semiconductor used in an embodiment of the present invention is preferably a compound represented by the following formula (3) or (4), because the organic semiconductor which is a compound represented by the following formula (3) or (4) has high symmetry and high mobility:

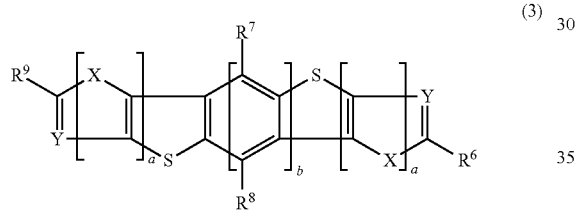

(3)

where: X represents any one of a sulfur atom and —CH=CH—; Y represents any one of =CH— and a nitrogen atom; $R^6$ and $R^9$ each independently represent a group selected from the group consisting of a hydrogen atom, halogen atoms, alkyl groups having 1 to 20 carbon atoms, alkoxy groups having 1 to 20 carbon atoms, aryl groups having 4 to 20 carbon atoms, alkenyl groups having 2 to 20 carbon atoms, and alkynyl groups having 2 to 20 carbon atoms and may be identical to or different from each other; $R^7$ and $R^8$ each independently represents a group selected from the group consisting of a hydrogen atom, alkyl groups having 1 to 20 carbon atoms, alkoxy groups having 1 to 20 to carbon atoms, and trialkylsilylethynyl groups; a represents an integer of 1 or 2; b represents an integer of 0 to 2; and in a case where X is —CH=CH—, Y represents =CH—;

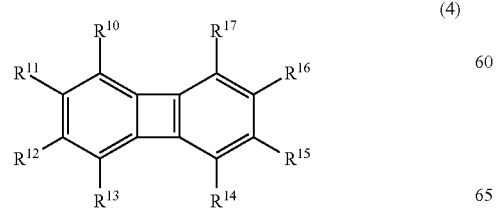

(4)

where: one to three of combinations of adjacent two of $R^{10}$ to $R^{17}$ constitute a unit represented by the following formula (5) and form a five-membered or six-membered ring; and the other of $R^{10}$ to $R^{17}$, which do not constitute the unit represented by the following formula (5), each independently represents a group selected from the group consisting of a hydrogen atom, halogen atoms, alkyl groups having 1 to 20 carbon atoms, alkenyl groups having 2 to 20 carbon atoms, alkynyl groups having 2 to 20 carbon atoms, and aryl groups having 4 to 26 carbon atoms:

(5)

where: X represents a group selected from the group consisting of an oxygen atom, a sulfur atom, a selenium atom, $CR^{19}$=$CR^{20}$, and $NR^{21}$; Y represents any one of $CR^{22}$ and a nitrogen atom; and $R^{18}$ to $R^{22}$ each independently represents a group selected from the group consisting of a hydrogen atom, halogen atoms, alkyl groups having 1 to 20 carbon atoms, alkenyl groups having 2 to 20 carbon atoms, alkynyl groups having 2 to 20 carbon atoms, and aryl groups having 4 to 26 carbon atoms.

Specific examples of the organic semiconductor used in an embodiment of the present invention include the following compounds:

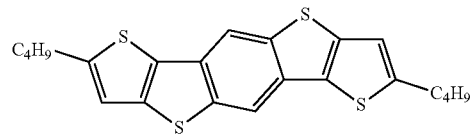

(B-1)

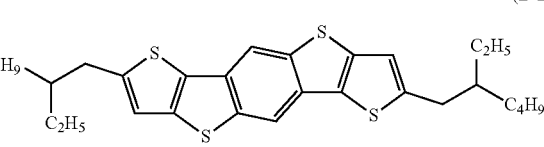

(B-2)

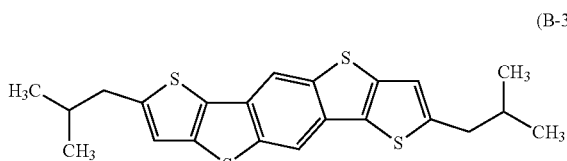

(B-3)

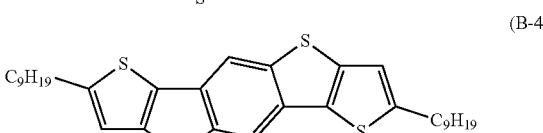

(B-4)

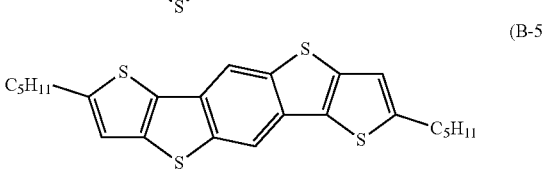

(B-5)

-continued
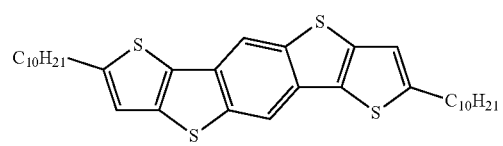
(B-6)
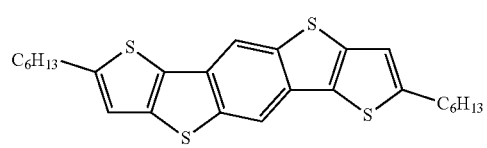
(B-7)
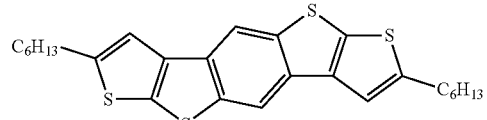
(B-8)
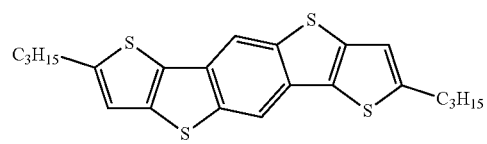
(B-9)
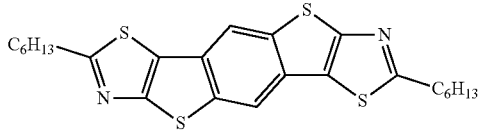
(B-10)
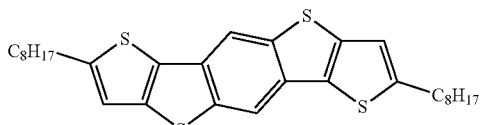
(B-11)
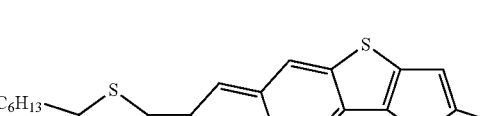
(B-12)
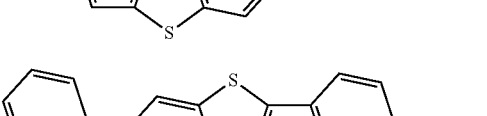
(B-13)
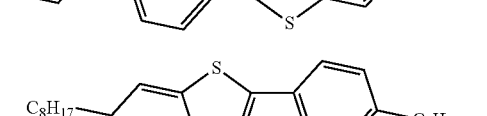
(B-14)
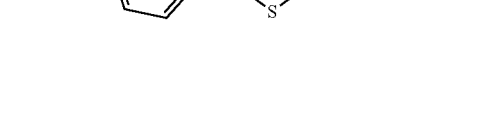
(B-15)
-continued
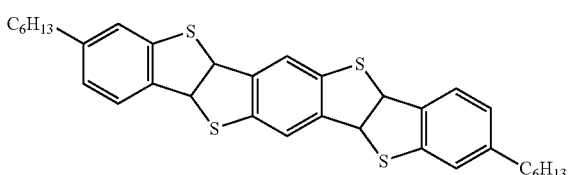
(B-16)
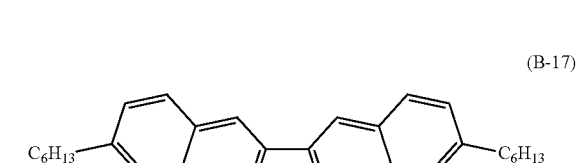
(B-17)
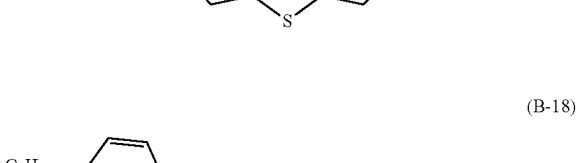
(B-18)
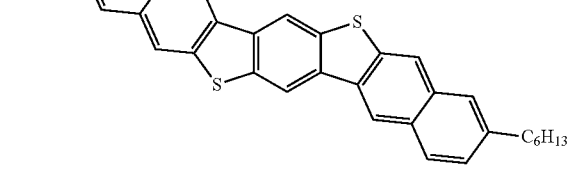
(B-19)
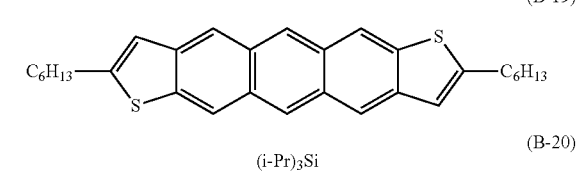
(B-20)
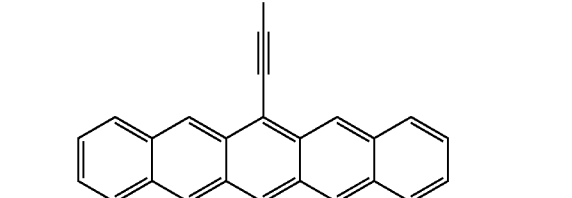
(B-21)

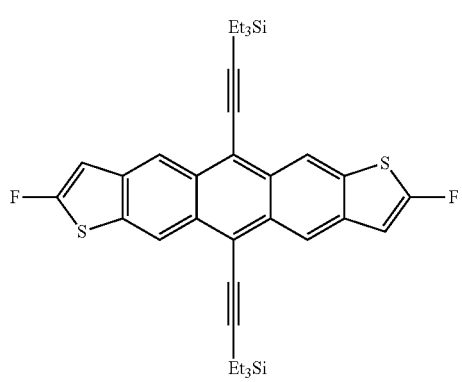 (B-22)
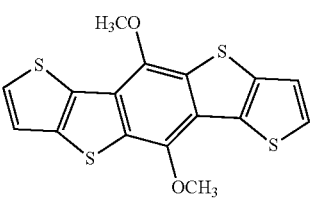 (B-23)
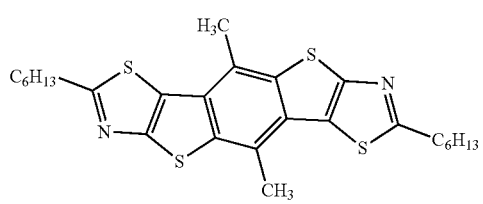 (B-24)
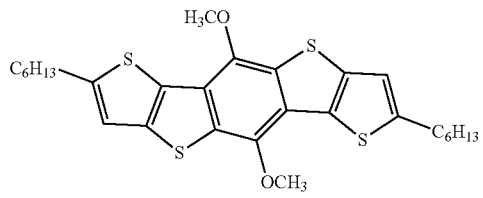 (B-25)
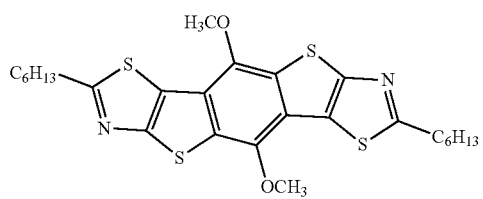 (B-26)
(B-27)
(B-28)
(B-29)
(B-30)
(B-31)
(B-32)
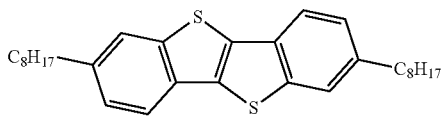 (B-33)
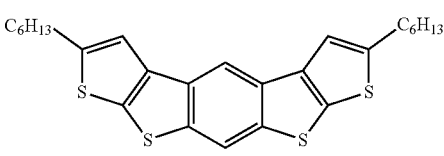 (B-34)
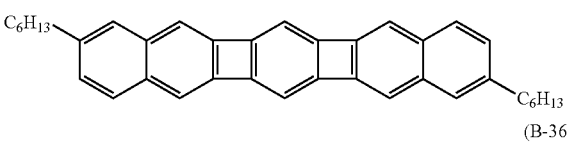 (B-35)
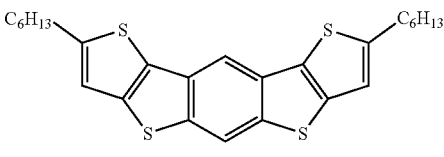 (B-36)
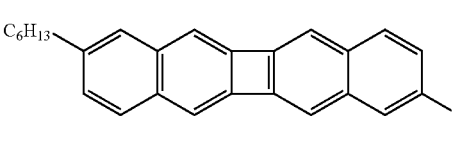 (B-37)

-continued

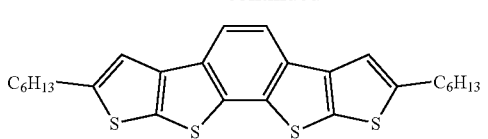
(B-38)

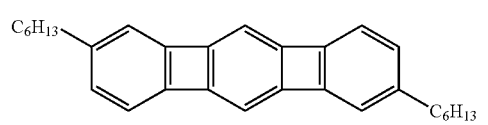
(B-39)

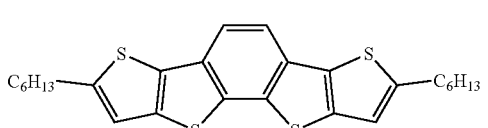
(B-40)

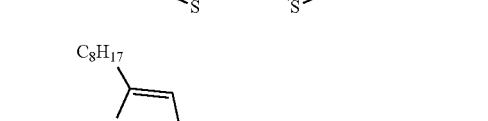
(B-41)

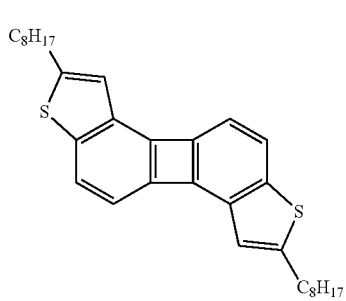
(B-42)

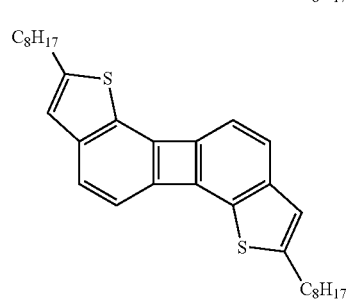
(B-43)

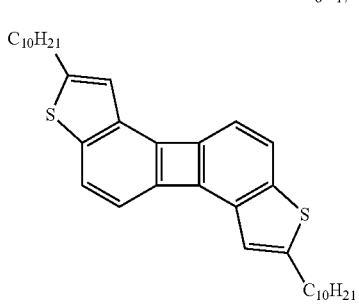
(B-44)

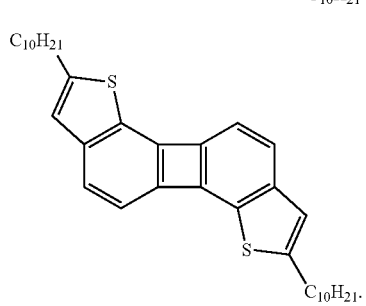

The organic semiconductor is preferably one of the group consisting of (B-1), (B-4), (B-5), (B-7), (B-9), (B-10), (B-11), (B-13), (B-14), (B-15), (B-17), (B-19), (B-20), (B-37), (B-39), (B-41), (B-42), (B-43), and (B-44), and is more preferably (B-5), (B-7), (B-9), (B-11), (B-13), (B-41), (B-42), (B-43), or (B-44), because the organic semiconductor which is any of the above compounds exhibits higher mobility.

According to the composition in accordance with an embodiment of the present invention, the organic semiconductor and the polymer (1) are mixed such that the composition contains the organic semiconductor in a proportion falling within the range of preferably not less than 5 parts by weight but not more than 90 parts by mass, and more preferably not less than 10 parts by weight but not more than 80 parts by mass, wherein the total amount of the organic semiconductor and the polymer (1) is regarded as 100 parts by mass.

The composition in accordance with an embodiment of the present invention may further contain an organic solvent. In this case, another embodiment of the present invention can be a solution for forming an organic semiconductor layer which solution contains the organic semiconductor, the polymer (1), and an organic solvent.

The organic solvent used as a constituent of the solution for forming an organic semiconductor layer in accordance with an embodiment of the present invention can be an organic solvent that allows the organic semiconductor and the polymer (1) to be dissolved therein. Any organic solvent may be used, provided that the organic solvent allows, in particular, the organic semiconductor represented by formula (2) to be dissolved therein. The organic solvent preferably has a boiling point of not lower than 100° C. under ordinary pressure, because this allows the drying rate of the organic solvent to be more suitable during formation of an organic semiconductor layer.

The organic solvent which can be used in an embodiment of the present invention can be, for example, at least one of the group consisting of: aromatic compounds such as toluene, tetralin, indan, mesitylene, o-xylene, isopropylbenzene, pentylbenzene, cyclohexylbenzene, 1,2,4-trimethylbenzene, anisole, 2-methyl anisole, 3-methyl anisole, 2,3-dimethyl anisole, 3,4-dimethyl anisole, 2,6-dimethyl anisole, benzothiazole, ethylphenyl ether, butylphenyl ether, 1,2-methylenedioxybenzene, 1,2-ethylenedioxybenzene, chlorobenzene, 1,2-dichlorobenzene, 1,3-dichlorobenzene, and 1,4-dichlorobenzene; ketones such as cyclohexanone, isophorone, and methyl ethyl ketone; saturated aliphatic compounds such as octane, nonane, decane, dodecane, and decalin; esters such as phenyl acetate and cyclohexyl acetate; glycols such as dipropylene glycol dimethyl ether, dipropylene glycol diacetate, dipropylene glycol methyl-n-propyl ether, dipropylene glycol methyl ether acetate, 1,4-butanediol diacetate, 1,3-butylene glycol diacetate, 1,3-butylene glycol diacetate, 1,6-hexanediol diacetate, ethylene glycol monomethyl ether acetate, propylene glycol monomethyl ether acetate, 3-methoxy butyl acetate, ethylene glycol monobutyl ether acetate, diethylene glycol monoethyl ether acetate, and diethylene glycol monobutyl ether acetate; and triacetylene. Among the above organic solvents, the aromatic compounds are preferable, because these organic solvents allow the organic semiconductor to be well dissolved therein. In particular, more preferable is at least one of the group consisting of toluene, tetralin, mesitylene, o-xylene, 1,2,4-trimethylbenzene, anisole, 2-methyl anisole, 3-methyl anisole, 2,3-dimethyl anisole, 3,4-dimethyl anisole, 2,6-dimethyl anisole, benzothiazole, 1,2-methylenedioxybenzene, 1,2-ethylenedioxybenzene, chlorobenzene, 1,2-dichlorobenzene, 1,3-dichlorobenzene, and 1,4-dichlorobenzene, because these organic solvents have a moderate drying rate.

Note that, as the organic solvent used in an embodiment of the present invention, one kind of organic solvent can be used alone. Alternatively, two or more kinds of organic solvent different in property, such as a boiling point, polarity, and/or a solubility parameter, can be used in admixture.

The solution for forming an organic semiconductor layer in accordance with an embodiment of the present invention is prepared by mixing the polymer (1), the organic semiconductor, and the organic solvent and dissolving the polymer (1) and the organic semiconductor in the organic solvent.

As a method of preparing the solution for forming an organic semiconductor, any method may be employed, provided that the method allows the polymer (1) and the organic semiconductor to be dissolved in the organic solvent. Examples of the method of preparing the solution for forming an organic semiconductor layer include: a method in which the polymer (1) and the organic semiconductor are simultaneously dissolved, as a mixture, in the organic solvent; a method in which the organic semiconductor is dissolved in a solution containing the organic solvent and the polymer (1); and a method in which the polymer (1) is dissolved in a solution containing the organic solvent and the organic semiconductor.

The organic semiconductor contained in the solution for forming an organic semiconductor layer in accordance with an embodiment of the present invention has a concentration falling within the range of preferably not less than 0.01% by weight but not more than 20.0% by weight, wherein the total amount of the organic semiconductor, the polymer (1), and the organic solvent is regarded as 100% by weight. This makes the solution easier to handle, thereby making the efficiency of forming an organic semiconductor layer greater. Moreover, the solution for forming an organic semiconductor layer which solution has a viscosity falling within the range of 0.3 mPa·s to 100 mPa·s exhibits a more suitable coating property.

Examples of an application method employed in a case where an organic semiconductor layer is formed with use of the solution for forming an organic semiconductor layer in accordance with an embodiment of the present invention include: simple coating methods such as spin coating, drop casting, dip coating, and cast coating; and printing methods such as dispenser printing, ink jet printing, slit coating, blade coating, flexographic printing, screen printing, gravure printing, and offset printing. In so doing, a substrate to which the solution is applied can be a substrate that will be described later. In particular, the spin coating method and the ink jet printing method are more preferable, because these methods make it possible to easily and efficiently form an organic semiconductor layer.

It is possible to form an organic semiconductor layer by, after applying the solution for forming an organic semiconductor layer in accordance with an embodiment of the present invention, drying the organic solvent so that the organic solvent is removed from the resultant coating layer.

The organic solvent can be dried and thereby removed from the applied solution for forming an organic semiconductor layer, under, for example, ordinary pressure or reduced pressure.

The temperature at which the organic solvent is dried and thereby removed from the applied solution for forming an organic semiconductor layer preferably falls within the range of 10° C. to 150° C., because such a temperature allows the organic solvent to be efficiently dried and thereby removed from an applied organic semiconductor layer to form an organic semiconductor layer.

When the organic solvent is dried and thereby removed from the applied solution for forming an organic semiconductor layer, it is possible to control the crystal growth of the organic semiconductor by adjusting the vaporizing rate of the organic solvent to be removed.

An organic semiconductor layer obtained by drying the organic solvent and thereby removing the organic solvent from the applied solution for forming an organic semiconductor layer has a film thickness of preferably 1 nm to 1 μm, more preferably 10 nm to 300 nm, and still more preferably 20 nm to 100 nm, for ease of control of the film thickness.

After an organic semiconducting layer is formed, the obtained organic semiconductor layer can be thermally annealed at 90° C. to 150° C. Since the organic semiconductor layer has high heat resistance, the organic semiconductor layer can be thermally annealed at not lower than 95° C. It is preferable that such a thermal annealing treatment be carried out after the organic solvent is removed from a coating film formed with use of the solution for forming an organic semiconductor layer.

The configuration of an organic semiconductor layer and the polymer (1) which are obtained by an embodiment of the present invention is not limited to any particular one, provided that an organic semiconductor layer in accordance with an embodiment of the present invention can be obtained. Examples of the configuration include the following (a) through (d):

(a) a layer structure in which a layer made of the organic semiconductor is formed as an upper layer and a layer made of the polymer (1) is formed as a lower layer;

(b) a layer structure in which a layer made of the polymer (1) is formed as an upper layer and a layer made of the organic semiconductor is formed as a lower layer;

(c) a layer structure in which a layer made of the organic semiconductor is formed as an upper layer, a layer made of the polymer (1) is formed as an intermediate layer, and a layer made of the organic semiconductor is formed as a lower layer; and (d) a layer structure in which a layer made of the polymer (1) is formed as an upper layer, a layer made of the organic semiconductor is formed as an intermediate layer, and a layer made of the polymer (1) is formed as a lower layer.

Hereinafter, a layer made of the organic semiconductor and a layer made of the polymer (1) are collectively referred to as an "organic semiconductor layer".

An organic semiconductor layer formed from the solution for forming an organic semiconductor layer in accordance with an embodiment of the present invention can be used as an organic semiconductor layer of an organic semiconductor device, in particular, an organic thin film transistor.

An organic thin film transistor can be obtained by stacking, on a substrate, an organic semiconductor layer to which a source electrode and a drain electrode are provided and a gate electrode with a gate insulating layer therebetween. By using, as the organic semiconductor layer, an organic semiconductor layer formed with use of the solution for forming an organic semiconductor layer in accordance with an embodiment of the present invention, it is possible to produce an organic thin film transistor which exhibits excellent semiconductor and electrical characteristics.

FIG. 1 illustrates cross-sectional structures of typical organic thin film transistors. Note, here, that: (A) illustrates an organic thin film transistor of a bottom gate-top contact type; (B) illustrates an organic thin film transistor of a bottom gate-bottom contact type; (C) illustrates an organic thin film transistor of a top gate-top contact type; and (D)

illustrates an organic thin film transistor of a top gate-bottom contact type. Each of the organic thin film transistors includes an organic semiconductor layer 1, a substrate 2, a gate electrode 3, a gate insulating layer 4, a source electrode 5, and a drain electrode 6. An organic semiconductor layer formed from the solution for forming an organic semiconductor layer in accordance with an embodiment of the present invention can be applied to any of the organic thin film transistors.

Specific examples of the substrate include: plastic substrates made of, for example, polyethylene terephthalate, polyethylene naphthalate, polymethyl methacrylate, polymethyl acrylate, polyethylene, polypropylene, polystyrene, cyclic polyolefin, fluorinated cyclic polyolefin, polyimide, polycarbonate, polyvinyl phenol, polyvinyl alcohol, poly(diisopropyl fumarate), poly(diethyl fumarate), poly(diisopropyl maleate), polyether sulfone, polyphenylene sulfide, cellulose triacetate, and the like; inorganic substrates made of, for example, glass, quartz, aluminum oxide, silicon, highly doped silicon, silicon oxide, tantalum dioxide, tantalum pentoxide, indium tin oxide, and the like; and metal substrates made of, for example, gold, copper, chromium, titanium, aluminum, and the like. Note that in a case where highly doped silicon is used for the substrate, the substrate can serve as a gate electrode.

The gate electrode in accordance with an embodiment of the present invention is not limited to any particular one, and examples of the gate electrode include gate electrodes made of inorganic materials such as aluminum, gold, silver, copper, highly doped silicon, tin oxide, indium oxide, indium tin oxide, chromium, titanium, tantalum, graphene, and carbon nanotube; and gate electrodes made of organic materials such as a doped electrically conductive polymer (e.g., PEDOT-PSS).

Examples of a method of forming the gate electrode include a vacuum evaporation method and an application method.

In a case where the gate electrode is produced by the application method, it is preferable to use a metal nanoparticle ink composed of an organic solvent and any of the above inorganic materials.

Preferable examples of the organic solvent include: polar solvents such as water, methanol, ethanol, 2-propanol, 1-butanol, and 2-butanol; aliphatic hydrocarbon solvents having 6 to 14 carbon atoms such as hexane, heptane, octane, decane, dodecane, and tetradecane; and aromatic hydrocarbon solvents having 7 to 14 carbon atoms such as toluene, xylene, mesitylene, ethylbenzene, pentylbenzene, hexylbenzene, octylbenzene, cyclohexylbenzene, tetralin, indan, anisole, 1,2-dimethoxybenzene, 1,3-dimethoxybenzene, 1,2-dimethyl anisole, 2,3-dimethyl anisole, and 3,4-dimethyl anisole, for appropriate dispersibility.

Examples of the application method employed in a case where the gate electrode is formed with use of the metal nanoparticle ink include: simple coating methods such as spin coating, drop casting, dip coating, and cast coating; and printing methods such as dispenser printing, ink jet printing, slit coating, blade coating, flexographic printing, screen printing, gravure printing, and offset printing. After the metal nanoparticle ink is applied, the organic solvent is dried and thereby removed, so that the gate electrode is produced.

After the metal nanoparticle ink is applied and dried, an annealing treatment is preferably carried out at a temperature falling within the range of 80° C. to 200° C. so that the electrical conductivity is enhanced.

The gate insulating layer in accordance with an embodiment of the present invention is not limited to any particular one, and examples of the gate insulating layer include: gate insulating layers made of inorganic materials such as silicon oxide, silicon nitride, aluminum oxide, aluminum nitride, titanium oxide, tantalum dioxide, tantalum pentoxide, indium tin oxide, tin oxide, vanadium oxide, barium titanate, and bismuth titanate; and gate insulating layers made of polymer insulating materials such as polymethyl methacrylate, polymethyl acrylate, polyimide, polycarbonate, polyvinyl phenol, polyvinyl alcohol, poly(diisopropyl fumarate), poly(diethyl fumarate), polyethylene terephthalate, polyethylene naphthalate, polyethyl cinnamate, polymethyl cinnamate, polyethyl sulfone, polypropylene-co-1-butene, crotonate, polyether polyisobutylene, polypropylene, polycyclopentane, polycyclohexane, a polycyclohexane-ethylene copolymer, polyfluorinated cyclopentane, polyfluorinated cyclohexane, a polyfluorinated cyclohexane-ethylene copolymer, fluorinated cyclic polyolefin, BCB resin (product name: CYCLOTENE, manufactured by Dow Chemical Company), Cytop (trademark), Teflon (trademark), and Parylene (trademark) (for example, Parylene C).

Further, the gate insulating layer which has a surface that has been subjected to a modification treatment with any of the following, for example, may be used: silanes such as octadecyltrichlorosilane, decyltrichlorosilane, decyltrimethoxysilane, octyltrichlorosilane, octadecyltrimethoxysilane, β-phenethyltrichlorosilane, β-phenethyltrimethoxysilane, phenyltrichlorosilane, phenyltrimethoxysilane, and phenyltriethoxysilane; and silylamines such as hexamethyldisilazane.

Materials similar to that of the gate electrode can be employed as materials of the source electrode and the drain electrode. The materials may be identical to or different from that of the gate electrode, and different kinds of materials may be stacked. In order that the efficiency of injecting carriers is increased, a surface treatment can be carried out with respect to these electrode materials. Examples of a surface treating agent used to carry out the surface treatment include benzenethiol, pentafluorobenzenethiol, 4-fluorobenzenethiol, and 4-methoxybenzenethiol.

An organic thin film transistor obtained with use of the solution for forming an organic semiconductor layer in accordance with an embodiment of the present invention has carrier mobility of not less than 0.5 $cm^2/V \cdot s$, preferably not less than 1.0 $cm^2/V \cdot s$. This allows the transistor to have faster operability.

An organic thin film transistor obtained with use of the solution for forming an organic semiconductor layer in accordance with an embodiment of the present invention has a current on-off ratio of preferably not less than $1.0 \times 10^5$. This allows the transistor to have a higher switching characteristic.

The solution for forming an organic semiconductor layer in accordance with an embodiment of the present invention and an organic semiconductor layer formed therefrom can be used for: organic thin film transistors for electronic paper, organic EL displays, liquid crystal displays, IC-tags (RFID tags), memories, sensors, and the like; organic EL display materials; organic semiconductor laser materials; organic thin film solar cell materials; and electronic materials such as photonic crystal materials, and are preferably used for semiconductor layers of organic thin film transistors because the organic semiconductor becomes a crystalline thin film.

Advantageous Effects of Invention

By using the solution for forming an organic semiconductor layer in accordance with an embodiment of the present invention, it is possible to provide an organic thin film transistor which exhibits high mobility, a high coating property, and high heat resistance.

BRIEF DESCRIPTION OF DRAWINGS

FIG. 1 illustrates cross-sectional structures of organic thin film transistors.

EXAMPLES

The present invention will be described below in more detail by means of examples, but the present invention is not limited by the examples.
(Chemical Structure of Synthesized Product)

For analyses of the chemical structures of products obtained in synthesis examples, 1H-NMR spectra were measured under the condition of 270 Mhz with use of JEOL GSX-270WB (product name, manufactured by JEOL Ltd.). Furthermore, with use of JEOL JMS-700 (product name, manufactured by JEOL Ltd.), samples were directly introduced, and the mass spectra (MS) of organic semiconductors were measured by an electron impact (EI) method (70 electron volts).
(Configuration of Organic Transistor)

In the examples, organic transistors produced so as to evaluate solutions for forming organic semiconductor layers were of a bottom gate-bottom contact type. Materials of constituent members and film forming methods are shown in the following table.

TABLE 1

| Constituent member | Constituent base material | Film forming method |
|---|---|---|
| Substrate | Glass | — |
| Gate electrode | Aluminum | Vacuum deposition |
| Gate insulating layer | Parylene C | CVD |
| Source and drain electrodes | Gold | Vacuum deposition |
| Surface treating agent | Pentafluorobenzenethiol | Immersion |
| Organic semiconductor | See examples | Drop casting |

(Evaluation of Organic Transistor)

In the examples, the electrical properties of the produced organic transistors were evaluated with use of a semiconductor parameter analyzer (4200SCS, manufactured by Keithley Instruments). Specifically, transfer properties (Id-Vg) were evaluated by carrying out scanning with a drain voltage (Vd=−20 V) and with a gate voltage (Vg) varied from +10 V to −20 V in 0.5 V increments. Based on the results of the evaluation, mobility and on-off ratios were calculated.
(Measurement of Glass Transition Point of Polymer (1))

In the examples, the glass transition points (Tg) of polymers (1) were measured with use of EXSTAR6000 DSC6226 (product name, manufactured by SII). Specifically, the glass transition points (Tg) were measured by, in a nitrogen atmosphere, rising a temperature at rate of 10° C./min and carrying out calorimetric analyses.
(Molecular Weight of Polymer (1))

In the examples, the weight-average molecular weights of the polymers (1) were measured with use of HLC-8320GPC (product name, manufactured by Tosoh Corporation) at 40° C. As the weight-average molecular weights of some commercially available products, values listed in catalogs were used.
(Organic Semiconductor)

The structures of the organic semiconductors used in the examples are shown below.

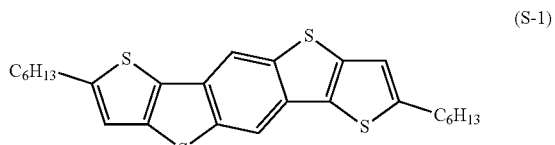
(S-1)

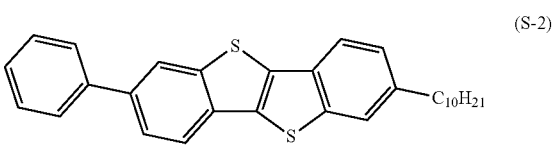
(S-2)

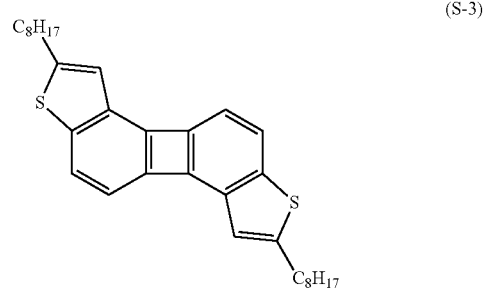
(S-3)

The above compound S-1 (2,7-di(n-hexyl)dithienobenzodithiophene) was synthesized by a method described in Synthesis Example 1 below in accordance with a method disclosed in Japanese Patent Application Publication Tokukai No. 2012-209329.

As the above compound S-2, 2-decyl-7-phenyl[1]benzothieno[3,2-b][1]benzothiophene (manufactured by Tokyo Chemical Industry Co., Ltd.) was used.

The above compound S-3 (2,7-dioctyldithienobiphenylene) was synthesized by methods described in Synthesis Examples 2 to 7 below in accordance with a method disclosed in Japanese Patent Application Publication Tokukai No. 2018-174322.
(Polymer (1))

The polymers (1) used in the examples are shown below.

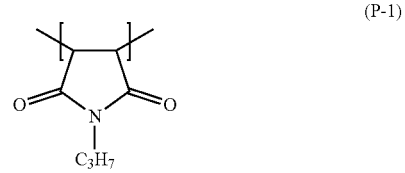
(P-1)

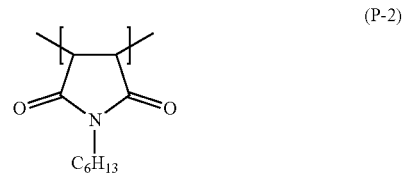
(P-2)

The above polymer P-1 was synthesized by a method described in Synthesis Example 8 below.

The above polymer P-2 was synthesized by methods described in Synthesis Examples 9 and 10 below.

The above polymer P-3 was synthesized by methods described in Synthesis Examples 11 and 12 below.

The above polymer P-4 was synthesized by a method described in Synthesis Example 13 below.

The above polymer P-5 was synthesized by a method described in Synthesis Example 14 below.

As the above polymer P-6, polystyrene (average Mw: up to 280,000 by GPC, manufactured by Sigma-Aldrich) was used.

As the above polymer P-7, polyethyl methacrylate (average Mw: up to 515,000 by GPC, powder, manufactured by Sigma-Aldrich) was used.

As the above polymer P-8, polyisobutyl methacrylate (product code: M0086, molecular weight: 49,000, manufactured by Tokyo Chemical Industry Co., Ltd.) was used.

Synthesis Example 1 (Synthesis of S-1,2,7-di(n-hexyl)dithienobenzodithiophene)

In a nitrogen atmosphere, 4.5 ml (3.6 mmol) of a THF solution of isopropylmagnesium bromide (0.80 M, manufactured by Tokyo Chemical Industry Co., Ltd.) and 10 ml of THF were introduced into a 100 ml Schlenk reaction vessel. The resultant mixture was cooled to −75° C., and 873 mg (3.61 mmol) of 2,3-dibromothiophene (manufactured by FUJIFILM Wako Pure Chemical Corporation) was added dropwise to the mixture. After the resultant mixture was aged at −75° C. for 30 minutes, 3.6 ml (3.6 mmol) of a diethyl ether solution of zinc chloride (1.0 M, manufactured by Aldrich) was added dropwise to the mixture. The temperature was gradually risen to a room temperature. A white slurry liquid thus produced was then concentrated under reduced pressure, and 10 ml of a light-boiling component was distilled off. To the resultant white slurry liquid (3-bromothienyl-2-zinc chloride), added were 272 mg (1.00 mmol) of 1,4-dibromo-2,5-difluorobenzene (manufactured by FUJIFILM Wako Pure Chemical Corporation), 39.1 mg (0.0338 mmol, 3.38 mol % with respect to 1,4-dibromo-2,5-difluorobenzene) of tetrakis(triphenylphosphine) palladium (manufactured by Tokyo Chemical Industry Co., Ltd.), which was a catalyst, and 10 ml of THF. A reaction was caused to occur at 60° C. for 8 hours, and then stopped by cooling the vessel with water and adding 3 ml of 3 N hydrochloric acid. An organic phase was extracted with use of toluene, washed with a saline solution, and then dried with use of anhydrous sodium sulfate. The organic phase was concentrated under reduced pressure. A residue thus obtained was refined by silica gel column chromatography (from hexane to hexane/dichloromethane=10/1), and further refined by recrystallization from hexane/toluene=6/4 to obtain 227 mg of a pale yellow solid of 1,4-di(3-bromothienyl)-2,5-difluorobenzene (yield: 52%).

$^1$H-NMR (CDCl3, 21° C.): δ=7.44 (d, J=5.4 Hz, 2H), 7.39 (t, J=7.8 Hz, 2H), 7.11 (d, J=5.4 Hz, 2H).

MS m/z: 436 (M+, 100%), 276 (M+−2Br, 13).

Further, in a nitrogen atmosphere, 200 mg (0.458 mmol) of 1,4-di(3-bromothienyl)-2,5-difluorobenzene, 10 ml of NMP, and 240 mg (1.00 mmol) of sodium sulfide nonahydrate (manufactured by FUJIFILM Wako Pure Chemical Corporation) were introduced into a 100 ml Schlenk reaction vessel. The resultant mixture was heated at 170° C. for 6 hours, and then the resultant reaction mixture was cooled to a room temperature. After toluene and water were added to the reaction mixture, phase splitting was carried out. An organic phase was then washed twice with water, and dried with use of anhydrous sodium sulfate. The organic phase was concentrated under reduced pressure. A residue thus obtained was washed twice with hexane to obtain 95 mg a pale of yellow solid of dithienobenzodithiophene (yield: 69%).

$^1$H-NMR (CDCl3, 60° C.): δ=8.28 (s, 2H), 7.51 (d, J=5.2 Hz, 2H), 7.30 (d, J=5.2 Hz, 2H).

MS m/z: 302 (M+, 100%), 270 (M+−S, 5), 151 (M+/2, 10).

Synthesis Example 2 (Synthesis of 2-bromo-1-fluoro-3-iodobenzene)

In a nitrogen atmosphere, 5.76 g (56.9 mmol) of diisopropylamine and 115.0 ml of THF (dehydrated grade) were introduced into a 500 ml Schlenk reaction vessel. The resultant solution was cooled to −50° C., and 34.0 ml (54.4 mmol) of a hexane solution of n-butyllithium (1.6 M, manufactured by Tokyo Chemical Industry Co., Ltd.) was added dropwise to the solution to prepare LDA. The resultant mixture was cooled to −78° C. Then, to the mixture, 11.5 g (51.8 mmol) of 1-fluoro-3-iodobenzene (Tokyo Chemical Industry Co., Ltd.) was added. The resultant mixture was held at −78° C. for 2 hours. To the mixture, a solution obtained by dissolving 34.4 g (103.6 mmol) of tetrabromomethane (Tokyo Chemical Industry Co., Ltd.) in 160.0 ml of THF (dehydrated grade) was added dropwise at −78° C., and then the temperature was gradually risen to a room temperature. Water and toluene were added to the resultant reaction mixture, and phase splitting was carried out. An organic phase was dried with use of anhydrous sodium sulfate, and concentrated under reduced pressure. A residue thus obtained was refined by silica gel column chromatography (solvent: hexane). Subsequently, 3.0 g of methanol (manufactured by FUJIFILM Wako Pure Chemical Corporation) was added to the resultant product. The temperature was risen to 50° C. so that recrystallization occurred. As a result, 7.43 g of a white solid of 2-bromo-1-fluoro-3-iodobenzene was obtained (yield: 43.3%).

MS m/z: 302 ($M^+$+2, 75%), 300 ($M^+$, 78%), 175 ($M^+$+ 2−I, 38%), 173 ($M^+$−I, 39%), 94 ($M^+$−BrI, 100%).

$^1$H NMR (CDCl$_3$): δ=7.68 to 7.64 (m, 1H), 7.12 to 7.08 (m, 1H), 7.05 to 7.00 (m, 1H)

Synthesis Example 3 (Synthesis of 2,2'-dibromo-3,6'-difluorobiphenyl)

In a nitrogen atmosphere, 4.89 g (16.3 mmol) of 1-bromo-3-fluoro-2-iodobenzene (Tokyo Chemical Industry Co., Ltd.) and 50.0 ml of THF (dehydrated grade) were introduced into a 200 ml Schlenk reaction vessel. The resultant solution was cooled to 0° C., and 8.4 ml (19.8 mmol) of a THF solution of ethylmagnesium chloride (2.0 M, Aldrich) was added dropwise to the solution. The resultant mixture was aged at 0° C. for 20 minutes to prepare 1-bromo-3-fluorophenyl-2-magnesium chloride.

Meanwhile, in a nitrogen atmosphere, 3.28 g (24.1 mmol) of zinc chloride (manufactured by FUJIFILM Wako Pure Chemical Corporation) and 30 ml of THF (dehydrated grade) were introduced into another 300 ml Schlenk reaction vessel. The resultant mixture was cooled to 0° C. To a white fine slurry solution thus obtained, a 1-bromo-3-fluorophenyl-2-magnesium chloride solution prepared previously was added dropwise with use of a Teflon (registered trademark) cannula. Further, while a 100 ml Schlenk reaction vessel and the Teflon (registered trademark) cannula were washed with 2 ml of THF (dehydrated grade), the THF was introduced into the vessel. The resultant mixture was stirred while the temperature of the mixture was gradually risen to a room temperature. To a slurry solution of 1-bromo-3-fluorophenyl-2-zinc chloride thus produced, added were 3.51 g (11.7 mmol) of 2-bromo-1-fluoro-3-iodobenzene synthesized in Synthesis Example 2 and 1.40 g (1.2 mmol, 10 mol % with respect to 2-bromo-1-fluoro-3-iodobenzene) of tetrakis(triphenylphosphine)palladium (Tokyo Chemical Industry Co., Ltd.), which was a catalyst. A reaction was caused to occur at 60° C. for 3 hours, and then stopped by cooling the vessel with water and adding 1 M hydrochloric acid. After toluene was added to the resultant reaction mixture, an organic phase was split, and dried with use of anhydrous sodium sulfate. The organic phase was concentrated under reduced pressure, and a residue thus obtained was refined by silica gel column chromatography (solvent: hexane). Obtained was 2.90 g of a colorless solid of 2,2'-dibromo-3,6'-difluorobiphenyl (yield: 71.3%).

$^1$H NMR (CDCl$_3$): δ=7.50 (d, J=8.2 Hz, 1H), 7.42 to 7.36 (m, 1H), 7.33 to 7.26 (m, 1H), 7.23 to 7.18 (m, 1H), 7.17 to 7.12 (m, 1H), 7.05 to 6.96 (d, J=7.3 Hz 1H).

Synthesis Example 4 (Synthesis of 1,5-difluorobiphenylene)

In a nitrogen atmosphere, 395.5 mg (1.1 mmol) of 2,2'-dibromo-3,6'-difluorobiphenyl synthesized in Synthesis Example 3 and 20 ml of THF (dehydrated grade) were introduced into a 100 ml Schlenk reaction vessel. The resultant mixture was cooled to −78° C., and 2.9 ml (4.6 mmol) of a hexane solution of n-butyllithium (1.6 M, manufactured by Kanto Chemical Co., Inc.) was added dropwise to the mixture. The resultant mixture was aged at −78° C. for 1 hour, the temperature was risen to −40° C. over 10 minutes, and then the mixture was aged for 1 hour. To the mixture, 1.50 g (4.8 mmol) of N-fluorobenzene sulfoneimide (Tokyo Chemical Industry Co., Ltd.) was added. The resultant mixture was stirred while the temperature of the mixture was gradually risen to a room temperature. After 1 M hydrochloric acid was added to the resultant reaction mixture, toluene was added, and phase splitting was carried out. An organic phase was dried with use of anhydrous sodium sulfate. The organic phase was concentrated under reduced pressure, and a residue thus obtained was refined by silica gel column chromatography (solvent: hexane). Obtained was 130.0 mg of a pale yellow solid of 1,5-difluorobiphenylene (yield: 51.7%).

MS m/z: 188 ($M^+$, 100%), 168 ($M^+$−HF, 15%), 94 ($M^+$−C$_6$H$_3$F, 15%).

$^1$H NMR (CDCl$_3$): δ=6.80 (ddd, 2H) δ=6.56 to 6.50 (m, 4H).

Synthesis Example 5 (Synthesis of biphenylene-1,5-bis(thioacetaldehyde dimethyl acetal)

In a nitrogen atmosphere, 57.6 mg (0.31 mmol) of 1,5-difluorobiphenylene synthesized in Synthesis Example 4, 398.0 mg (1.65 mmol) of sodium sulfide nonahydrate (manufactured by FUJIFILM Wako Pure Chemical Corporation), and 4 ml of NMP (manufactured by FUJIFILM Wako Pure Chemical Corporation) were introduced into a 100 ml Schlenk reaction vessel. The resultant mixture was stirred at 110° C. for 6 hours. To the resultant reaction mixture, 578.2 mg (3.42 mmol) of 2-bromoacetaldehyde dimethyl acetal (Tokyo Chemical Industry Co., Ltd.) was added. The mixture was then heated and stirred at 100° C. for 3 hours. The resultant reaction mixture was cooled to a room temperature, and then water and toluene were added to the mixture. After phase splitting was carried out, an organic phase was dried with use of anhydrous sodium sulfate. The organic phase was concentrated under reduced pressure, and a residue thus obtained was refined by silica gel column chromatography (solvent; hexane/ethyl acetate=10/1 to 10/2). Further, a low-boiling component was removed under reduced pressure to obtain 65.4 mg of a yellow solid of biphenylene-1,5-bis(thioacetaldehyde dimethyl acetal) (yield: 64.7%).

$^1$H NMR (CDCl$_3$): δ=6.70 (d, J=5.5 Hz, 2H), 6.69 (d, J=1.4 Hz, 2H), 6.54 (dd, J=5.5 Hz, 1.4 Hz, 2H), 4.53 (t, J=5.9 Hz, 2H), 3.38 (s, 12H), 3.10 (d, J=5.9, Hz, 4H).

Synthesis Example 6 (Synthesis of Dithienobiphenylene Derivative)

In a nitrogen atmosphere, 57.7 mg (0.15 mmol) of biphenylene-1,5-bis(thioacetaldehyde dimethyl acetal) synthesized in Synthesis Example 5, 109.4 mg of polyphosphoric acid (manufactured by FUJIFILM Wako Pure Chemical Corporation), and 4 ml of chlorobenzene (manufactured by FUJIFILM Wako Pure Chemical Corporation) were introduced into a 50 ml Schlenk reaction vessel. The resultant mixture was stirred at 130° C. for 5 hours. The resultant reaction mixture was cooled to a room temperature, and then water and toluene were added to the mixture. After phase splitting was carried out, an organic phase was washed with water and dried with use of anhydrous sodium sulfate. The organic phase was concentrated under reduced pressure, and a residue thus obtained was refined by silica gel column chromatography (solvent; hexane/ethyl acetate=10/1 to 10/2). As a result, 22.5 mg of a yellow solid of a dithienobiphenylene derivative was obtained (yield: 55%).

MS m/z: 264 ($M^+$).

Synthesis Example 7 (Synthesis of S-3, 2,7-dioctyldithienobiphenylene)

In a nitrogen atmosphere, 22.5 mg (0.085 mmol) of the dithienobiphenylene derivative synthesized in Synthesis Example 6 and 4 ml of THF (dehydrated grade) were introduced into a 50 ml Schlenk reaction vessel. The resultant mixture was cooled to 0° C., and 0.20 ml (0.32 mmol) of a hexane solution of n-butyllithium (1.6 M, Tokyo Chemical Industry Co., Ltd.) was added dropwise to the mixture. After the resultant mixture was aged at 60° C. for 2 hours, 136 mg (0.567 mmol) of 1-iodooctane (manufactured by FUJIFILM Wako Pure Chemical Corporation) was added to the mixture. The resultant mixture was stirred at 60° C. for 7 hours. After the resultant reaction mixture was cooled with ice and 1 M hydrochloric acid was added to the reaction mixture, toluene was added to the resultant mixture and phase splitting was carried out. An organic phase was washed with water, dried with use of anhydrous sodium sulfate, and then concentrated under reduced pressure. A residue thus obtained was refined by silica gel column chromatography (solvent; hexane). As a result, 17 mg of a yellow solid of 2,7-dioctyldithienobiphenylene (S-3) was obtained (yield: 41%).

MS ($APCI^+$) m/z: 489 ($M^+$+H).

Synthesis Example 8 (Synthesis of P-1)

The polymer (P-1) was synthesized in accordance with the following scheme.

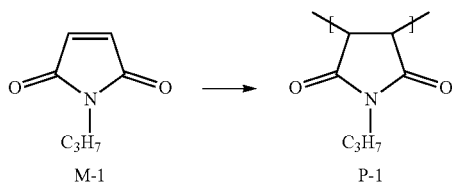

Mixed were 1.04 g (7.5 mmol) of a compound (M-1), which was N-propylmaleimide (manufactured by Aldrich), 6.1 mg (0.0375 mmol) of a polymerization initiator, which was 2,2'-azobis(isobutyronitrile) (manufactured by Tokyo Chemical Industry Co., Ltd.), and 1.04 g of toluene. The resultant mixture was sealed in an ampule tube in a nitrogen atmosphere. The ampule tube was heated and shaken at 60° C. for 12 hours and then allowed to cool to a room temperature.

The resultant reaction solution was added dropwise to 200 g of methanol, and a polymer was precipitated. Subsequently, filtration was carried out. A solid obtained by the filtration was washed by pouring 100 g of methanol. Thereafter, the washed solid was dried under reduced pressure to obtain 0.85 g of the polymer (P-1). The P-1 thus obtained had a molecular weight of Mw 17,000 and a glass transition point of 209° C.

Synthesis Example 9 (Synthesis of Monomer M-2 (Raw Material of P-2))

A monomer (M-2), which was N-hexylmaleimide, was synthesized in accordance with the following scheme.

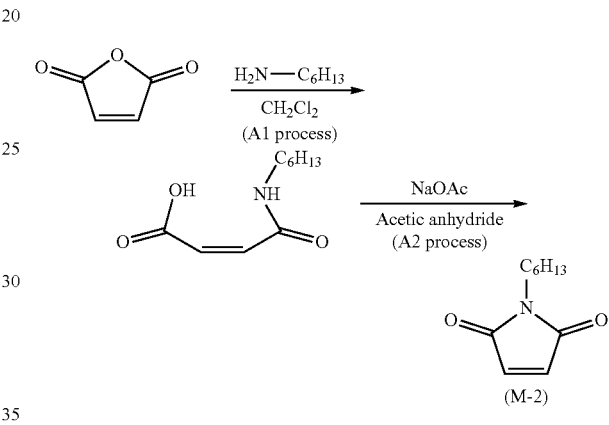

(A1 Process)

In a nitrogen atmosphere, 49.0 g (0.50 mmol) of maleic anhydride (manufactured by Tokyo Chemical Industry Co., Ltd.), 50.6 g (0.50 mmol) of hexylamine (manufactured by Tokyo Chemical Industry Co., Ltd.), and 500 ml of dichloromethane (special grade, manufactured by FUJIFILM Wako Pure Chemical Corporation) were introduced into a 1000 mL three-neck flask. The resultant mixture was stirred at 25° C. for 2 hours.

The resultant reaction solution was cooled in an ice bath, and a solid was precipitated. Subsequently, filtration was carried out. Thereafter, the solid was dried under reduced pressure to obtain 95.3 g of a white solid of N-hexylmaleamic acid (yield: 95.7%).

(A2 Process)

In a nitrogen atmosphere, 46.9 g (0.24 mmol) of N-hexylmaleamic acid, 6.4 g (0.08 mmol) of sodium acetate (manufactured by Tokyo Chemical Industry Co., Ltd.), and 150 mL of acetic anhydride (special grade, manufactured by FUJIFILM Wako Pure Chemical Corporation) were introduced into a 1000 mL three-neck flask. The resultant mixture was stirred at 100° C. for 1.5 hours, and then allowed to cool to a room temperature. After water was added to the resultant reaction solution, diethyl ether was added to the resultant solution, and phase splitting was carried out. An organic layer was washed with 3 M aqueous potassium hydroxide and water, and then dried with anhydrous sodium sulfate. The organic layer was concentrated under reduced pressure, and a residue thus obtained was refined by silica gel column chromatography. As a result, 20.3 g of a colorless liquid of N-hexylmaleimide was obtained (yield: 46.7%).

$^1$H NMR (CDCl$_3$, 25° C.): δ=0.84 (t, J=6.78 Hz, 3H), 1.14 to 1.31 (m, 6H), 1.47 (quin, J=7.01 Hz, 2H), 3.38 (t, J=7.01 Hz, 2H), 7.01 (s, 2H)

Synthesis Example 10 (Synthesis of P-2)

Synthesis similar to that in Synthesis Example 8 was carried out to obtain the polymer (P-2), except that 1.35 g of the compound (M-2), which was N-hexylmaleimide and which was obtained in Synthesis Example 9, was used instead of the compound (M-1). The P-2 thus obtained had a molecular weight of Mw 220,000 and a glass transition point of 150° C.

Synthesis Example 11 (Synthesis of Monomer M-3 (Raw Material of Polymer P-3))

Synthesis similar to that in Synthesis Example 9 was carried out to obtain a monomer (M-3), which was N-dodecylmaleimide, except that 92.7 g (0.5 mmol) of a compound of dodecylamine (manufactured by Tokyo Chemical Industry Co., Ltd.) was used instead of hexylamine.

$^1$H NMR (CDCl$_3$, 25° C.): δ=0.88 (t, J=6.40 Hz, 3H), 1.21 to 1.34 (m, 18H), 1.51 to 1.64 (m, 3H), 3.50 (t, J=7.32 Hz, 2H), 6.68 (s, 2H))

Synthesis Example 12 (Synthesis of P-3)

Synthesis similar to that in Synthesis Example 8 was carried out to obtain the polymer (P-3), except that 1.99 g of the compound (M-3), which was N-dodecylmaleimide and which was obtained in Synthesis Example 10, was used instead of the compound (M-1). The P-3 thus obtained had a molecular weight of Mw 29,000 and a glass transition point of 111° C.

Synthesis Example 13 (Synthesis of P-4)

Synthesis similar to that in Synthesis Example 8 was carried out to obtain the polymer (P-4), which was poly N-cyclohexylmaleimide, except that 1.34 g of a commercially available compound (M-4), which was N-cyclohexylmaleimide (manufactured by Tokyo Chemical Industry Co., Ltd.), was used instead of the compound (M-1). The P-4 thus obtained had a molecular weight of Mw 130,000 and a glass transition point of 277° C.

Synthesis Example 14 (Synthesis of P-5)

Synthesis similar to that in Synthesis Example 8 was carried out to obtain the polymer (P-5), except that the compound (M-1), a polymerization initiator, and, furthermore, 1.40 g of a compound (M-5), which was N-benzylmaleimide (manufactured by Tokyo Chemical Industry Co., Ltd.), were used. The P-5 thus obtained had a molecular weight of Mw 150,000 and a glass transition point of 178° C.

Example 1

(DSC of Polymer)
In an air atmosphere, 10.0 mg of the polymer (P-4) (poly N-cyclohexylmaleimide) was measure out into an alumina pan. According to calorimetry of the alumina pan, the polymer had a Tg of 277° C.

(Preparation of Solution for Forming Organic Semiconductor Layer)
In an air atmosphere, 2.5 g of toluene (boiling point: 110° C.), 5 mg of the compound (S-1), which was 2,7-di(n-hexyl) dithienobenzodithiophene, and 1.25 mg of the polymer (P-4), which was poly N-cyclohexylmaleimide, were introduced into a 2 ml sample tube, and heated to 40° C. so that they dissolved. As a result, a solution for forming an organic semiconductor layer was prepared.

(Preparation of Organic Semiconductor Layer and Organic Thin Film Transistor)
In an air atmosphere, 0.22 ml of the solution for forming an organic semiconductor layer prepared by the above-described method was drop-cast on a bottom-contact substrate shown in Table 1 above with use of a micropipettor at a room temperature)(25° C. The solution was naturally dried at a room temperature (25° C.) for 24 hours. Subsequently, the solution was dried at 40° C. for 3 hours by heating. As a result, a thin film of an organic semiconductor layer having a thickness of 50 nm was prepared. It was confirmed that the thin film was arranged such that a layer made of the organic semiconductor was formed as an upper layer and a layer made of the polymer (1) was formed as a lower layer.

(Measurement of Electrical Properties)
The electrical properties of the organic thin film transistor (channel length/channel width=100 μm/500 μm) produced by the above-described method were measured, and the mobility and the on-off ratio of the organic thin film transistor were evaluated in accordance with the following criteria.

(Criteria for Evaluation of Mobility)
A: A case where the mobility was not less than 1.0 cm$^2$/V·s.
B: A case where the mobility was not less than 0.01 cm$^2$/V·s but less than 1.0 cm$^2$/V·s.
C: A case where the mobility was less than 0.01 cm$^2$/V·s.

(Criteria for Evaluation of On-Off Ratio)
A: A case where the on-off ratio was not less than 1.0×10$^6$.
B: A case where the on-off ratio was not less than 1.0×10$^5$ but less than 1.0×10$^6$.
C: A case where the on-off ratio was less than 1.0×10$^5$.

(Evaluation of Heat Resistance)
In order that enhancement of the heat resistance of the organic semiconductor layer by addition of the polymer (1) was evaluated, the organic thin film transistor which had been subjected to the above-described measurement of the electrical properties was further heat-treated at 120° C. for 10 minutes. The electrical characteristics of the transistor which had been heat-treated were measured again, and a decrease in the mobility was calculated as follows:

Decrease in mobility=mobility before heat treatment−mobility after heat treatment.

The decrease in the mobility was evaluated in accordance with the following criteria.

(Criteria for Evaluation of Decrease in Mobility)
A: A case where the decrease in the mobility was less than 0.1 cm$^2$/V·s.
B: A case where the decrease in the mobility was not less than 0.1 cm$^2$/V·s but less than 0.5 cm$^2$/V·s.
C: A case where the decrease in the mobility was not less than 0.5 cm$^2$/V·s.
D: A case where the transistor became inoperative.

Examples 2 Through 9

Organic thin film transistors were produced by methods similar to that in Example 1, except that the polymers shown in Table 2 were used as polymers. Measurement of the electrical properties and evaluation of the heat resistance were carried out. The results are shown in Table 2. It was confirmed that thin films of the organic semiconductor compositions in Examples 2 through 9 were each arranged such that a layer made of the organic semiconductor was formed as an upper layer and a layer made of the polymer (1) was formed as a lower layer.

Comparative Examples 1 Through 4

Organic thin film transistors were produced by methods similar to that in Example 1, except that the polymers shown in Table 2 were used as polymers. Measurement of the electrical properties and evaluation of the heat resistance were carried out. The results are shown in Table 2.

TABLE 2

| | Semi-conductor | Polymer | | Solvent | Tg °C. |
|---|---|---|---|---|---|
| Example 1 | S-1 | P-4 | Poly N-cyclohexylmaleimide | Toluene | 277 |
| Example 2 | S-1 | P-1 | Poly N-propylmaleimide | Toluene | 209 |
| Example 3 | S-1 | P-2 | Poly N-hexylmaleimide | Toluene | 150 |
| Example 4 | S-1 | P-3 | Poly N-dodecylmaleimide | Toluene | 111 |
| Example 5 | S-1 | P-5 | Poly N-hexylmaleimide-co-poly N-benzylmaleimide | Toluene | 178 |
| Example 6 | S-2 | P-2 | Poly N-hexylmaleimide | Toluene | 150 |
| Example 7 | S-2 | P-4 | Poly N-cyclohexylmaleimide | Toluene | 277 |
| Example 8 | S-3 | P-2 | Poly N-hexylmaleimide | Toluene | 150 |
| Example 9 | S-3 | P-4 | Poly N-cyclohexylmaleimide | Toluene | 277 |
| Comparative Example 1 | S-1 | P-7 | Polyethyl methacrylate | Toluene | 63 |
| Comparative Example 2 | S-1 | P-8 | Polyisobutyl methacrylate | Toluene | 63 |
| Comparative Example 3 | S-1 | P-6 | Polystyrene | Toluene | 105 |
| Comparative Example 4 | S-2 | P-6 | Polystyrene | Toluene | 105 |

TABLE 3

| | Mobility cm²/V·s | | On-off ratio | | Heat resistance (Decrease in mobility) cm²/V·s | |
|---|---|---|---|---|---|---|
| Example 1 | 3.16 | A | 4.8 × 10⁶ | A | 0.13 | B |
| Example 2 | 1.88 | A | 3.6 × 10⁵ | B | 0.38 | B |
| Example 3 | 1.89 | A | 1.0 × 10⁷ | A | 0.09 | A |
| Example 4 | 2.27 | A | 6.2 × 10⁶ | A | 0.39 | B |
| Example 5 | 1.49 | A | 6.4 × 10⁶ | A | 0.00 | A |
| Example 6 | 2.37 | A | 4.2 × 10⁵ | B | 0.40 | B |
| Example 7 | 1.28 | A | 2.5 × 10⁵ | B | 0.03 | A |
| Example 8 | 0.03 | B | 1.5 × 10⁵ | B | 0.02 | A |
| Example 9 | 0.02 | B | 1.0 × 10⁵ | B | 0.01 | A |
| Comparative Example 1 | 0.38 | A | 1.4 × 10⁴ | C | — | D |
| Comparative Example 2 | 0.91 | A | 4.6 × 10⁴ | C | — | D |
| Comparative Example 3 | 3.21 | A | 2.2 × 10⁵ | A | 1.00 | C |
| Comparative Example 4 | 3.63 | A | 9.4 × 10⁶ | A | 1.16 | C |

Although the present invention has been described in detail and with reference to specific embodiments, it is apparent to a person skilled in the art that various changes and modifications may be made without departing from the nature and the scope of the present invention.

It should be noted that the entire contents of the specification, claims, drawings, and abstract of Japanese Patent Application No. 2018-238175, filed on Dec. 20, 2018, are incorporated herein by reference.

INDUSTRIAL APPLICABILITY

It is possible to produce an organic thin film transistor having both excellent electrical properties and high heat resistance, by using the solution for forming an organic semiconductor layer in accordance with an embodiment of the present invention. Therefore, the solution for forming an organic semiconductor layer in accordance with an embodiment of the present invention is expected to be employed as a material of a semiconductor device.

The invention claimed is:

1. A composition comprising:
an organic semiconductor; and
a polymer (1) having at least one unit selected from the group consisting of units represented by the following formulae (1-a) and (1-c):

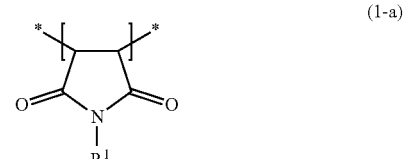

(1-a)

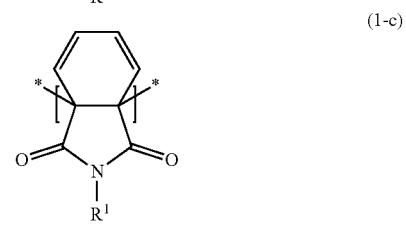

(1-c)

where $R^1$ represents an organic group selected from the group consisting of a hydrogen atom, halogen atoms, alkyl groups having 1 to 20 carbon atoms, alkoxy groups having 1 to 20 carbon atoms, aryl groups having 4 to 20 carbon atoms, alkenyl groups having 2 to 20 carbon atoms, alkynyl groups having 2 to 20 carbon atoms, and cycloalkyl groups having 3 to 20 carbon atoms.

2. The composition as set forth in claim 1, wherein the organic semiconductor is a compound represented by the following formula (2):

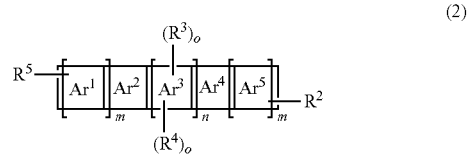

(2)

where: ring systems $Ar^1$ and $Ar^5$ each independently represent a ring selected from the group consisting of a thiophene ring, a thiazole ring, and a benzene ring; ring systems $Ar^2$ and $Ar^4$ each independently represent a ring selected from the group consisting of a thiophene ring, a benzene ring, and a cyclobutene ring; a ring system $Ar^3$ represents a ring selected from the group consisting of a benzene ring, a thiophene ring, and a cyclobutene ring; $R^2$ and $R^5$ each independently represent a group selected from the group consisting of a hydrogen atom, halogen atoms, alkyl groups having 1 to 20 carbon atoms, aryl groups having 4 to 20 carbon atoms, alkenyl groups having 2 to 20 carbon atoms, and alkynyl groups having 2 to 20 carbon atoms; $R^3$ and $R^4$ each independently represent a group selected from the group consisting of a hydrogen atom, alkyl groups having 1 to 20 carbon atoms, alkoxy groups having 1 to 20 carbon atoms, and trialkylsilylethynyl groups; m represents an integer of 1 or 2; n represents an integer of 0 to 2; o represents an integer of 0 or 1; and in a case where the ring system $Ar^3$ is a thiophene ring or a cyclobutene ring, o is an integer of 0.

3. The composition as set forth in claim 1, wherein the organic semiconductor is a compound represented by the following formula (3) or (4):

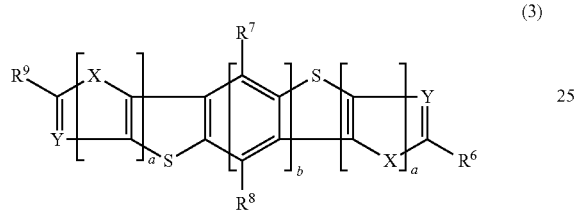

(3)

where: X represents any one of a sulfur atom and —CH═CH—; Y represents any one of ═CH— and a nitrogen atom; $R^6$ and $R^9$ each independently represent a group selected from the group consisting of a hydrogen atom, halogen atoms, alkyl groups having 1 to 20 carbon atoms, alkoxy groups having 1 to 20 carbon atoms, aryl groups having 4 to 20 carbon atoms, alkenyl groups having 2 to 20 carbon atoms, and alkynyl groups having 2 to 20 carbon atoms and may be identical to or different from each other; $R^7$ and $R^8$ each independently represents a group selected from the group consisting of a hydrogen atom, alkyl groups having 1 to 20 carbon atoms, alkoxy groups having 1 to 20 carbon atoms, and trialkylsilylethynyl groups; a represents an integer of 1 or 2; b represents an integer of 0) to 2; and in a case where X is —CH═CH—, Y represents ═CH—; and

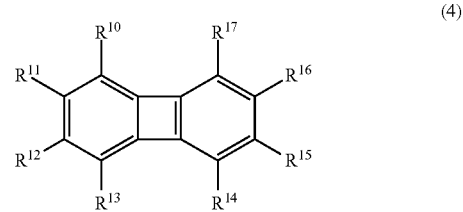

(4)

where: one to three of combinations of adjacent two of $R^{10}$ to $R^{17}$ constitute a unit represented by the following formula (5) and form a five-membered or six-membered ring; and the other of $R^{10}$ to $R^{17}$, which do not constitute the unit represented by the following formula (5), each independently represents a group selected from the group consisting of a hydrogen atom, halogen atoms, alkyl groups having 1 to 20 carbon atoms, alkenyl groups having 2 to 20 carbon atoms, alkynyl groups having 2 to 20 carbon atoms, and aryl groups having 4 to 26 carbon atoms:

(5)

where: X represents one selected from the group consisting of an oxygen atom, a sulfur atom, a selenium atom, $CR^{19}$═$CR^{20}$, and $NR^{21}$; Y represents any one of $CR^{22}$ and a nitrogen atom; and $R^{18}$ to $R^{22}$ each independently represents a group selected from the group consisting of a hydrogen atom, halogen atoms, alkyl groups having 1 to 20 carbon atoms, alkenyl groups having 2 to 20 carbon atoms, alkynyl groups having 2 to 20 carbon atoms, and aryl groups having 4 to 26 carbon atoms.

4. A solution for forming an organic semiconductor layer, comprising:
a composition according to claim 1; and
an organic solvent.

5. An organic semiconductor layer comprising a composition according to claim 1.

6. An organic thin film transistor comprising an organic semiconductor layer recited in claim 5.

* * * * *